US011531591B2

(12) United States Patent
Moussa et al.

(10) Patent No.: US 11,531,591 B2
(45) Date of Patent: *Dec. 20, 2022

(54) METHOD AND SYSTEM UTILIZING QUINTUPLE PARITY TO PROVIDE FAULT TOLERANCE

(71) Applicant: ARIZONA BOARD OF REGENTS ON BEHALF OF THE UNIVERSITY OF ARIZONA, Tucson, AZ (US)

(72) Inventors: Mohamad Moussa, Tucson, AZ (US); Marek Rychlik, Tucson, AZ (US)

(73) Assignee: ARIZONA BOARD OF REGENTS ON BEHALF OF THE UNIVERSITY OF ARIZONA, Tucson, AZ (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/306,728

(22) Filed: May 3, 2021

(65) Prior Publication Data

US 2021/0263797 A1    Aug. 26, 2021

Related U.S. Application Data

(63) Continuation of application No. 16/521,256, filed on Jul. 24, 2019, now Pat. No. 10,997,024, which is a
(Continued)

(51) Int. Cl.
*G06F 11/10* (2006.01)
*G06F 3/06* (2006.01)
*G06F 3/00* (2006.01)

(52) U.S. Cl.
CPC ........ *G06F 11/1088* (2013.01); *G06F 3/0604* (2013.01); *G06F 3/0659* (2013.01); *G06F 3/0689* (2013.01)

(58) Field of Classification Search
CPC .. G06F 11/1088; G06F 3/0604; G06F 3/0659; G06F 3/0689; G06F 11/10;
(Continued)

(56) References Cited

U.S. PATENT DOCUMENTS 4,476,562 A    10/1984  Sako et al.
8,683,296 B2   3/2014   Anderson et al.
(Continued)

OTHER PUBLICATIONS

International Search Report for PCT Application No. PCT/US18/14420 dated Mar. 8, 2018.
(Continued)

*Primary Examiner* — Justin R Knapp
(74) *Attorney, Agent, or Firm* — Nguyen Tarbet LLC

(57) ABSTRACT

An error correction and fault tolerance method and system for an array of disks is presented. The array comprises k+5 disks, where k disks store user data and 5 disks store computed parity. The present invention further comprises a method and a system for reconstituting the original content of each of the k+5 disks, when up to 5 disks have been lost, wherein the number of disks at unknown locations is E and the number of disks wherein the location of the disks is known is Z. All combinations of faulty disks wherein $Z+2 \times E \leq 4$ are reconstituted. Some combinations of faulty disks wherein $Z+2 \times E \geq 5$ are either reconstituted, or errors are limited to a small list.

20 Claims, 14 Drawing Sheets

Related U.S. Application Data continuation-in-part of application No. PCT/US2018/014420, filed on Jan. 19, 2018.

(60) Provisional application No. 62/449,920, filed on Jan. 24, 2017.

(58) Field of Classification Search
CPC ...... H03M 13/03; H03M 13/05; H03M 13/07; H03M 13/15; H03M 13/27
See application file for complete search history.

(56) References Cited

U.S. PATENT DOCUMENTS

| | | | |
|---|---|---|---|
| 9,417,821 | B2 | 8/2016 | Slaight et al. |
| 9,984,771 | B2 * | 5/2018 | Bonke ................. G06F 11/1076 |
| 10,031,803 | B2 * | 7/2018 | Blaum ................. G06F 11/1076 |
| 2008/0201630 | A1 | 8/2008 | Ikeuchi et al. |
| 2014/0380127 | A1 | 12/2014 | Alexeev et al. |
| 2015/0089282 | A1 | 3/2015 | Taranta, II |
| 2015/0161000 | A1 | 6/2015 | Kim et al. |
| 2016/0026527 | A1 | 1/2016 | Marov et al. |
| 2019/0087271 | A1 | 3/2019 | Taranta |

OTHER PUBLICATIONS

Anvin, Peter H. (2009). The Mathematics of RAID-6, url: https://www.kernel.org/pub/linux/kernel/people/hpa/raid6.pdf.

Bairavasundaram, Lakshmi N. et al. (2008). "An Analysis of Data Corruption in the Storage Stack". In: Trans. Storage 4.3, 8:1-8:28. issn: 1553-3077. doi: 10.1145/1416944.1416947. url: http://doi.acm.org/10.1145/1416944.1416947.

Grigoriev, D. (2013). "Polynomial Complexity of Solving Systems of Few Algebraic Equations with Small Degrees". In: Lecture Notes in Computer Science 1.8136, 136-139 url: http://www.ingentaconnect.com/content/ssam/03029743/2013/00000001/00008136/art00011.

Leventhal, Adam (2009). "Triple-Parity RAID and Beyond". In: Queue 7.11, 30:30-30:39. issn: 1542-7730. doi: 10.1145/1661785.1670144. url: http://doi.acm.org/10.1145/1661785.1670144.

Mann, Sarah Edge (2013). The Original View of Reed-Solomon Coding and the Welch-Berlekamp Decoding Algorithm, url: http://hdl.handle.net/10150/301533.

Moon, Todd K. (2005). "Linear Block Codes". In: Error Correction Coding. John Wiley & Sons, Inc., 83-112. isbn: 9780471739210. doi: 10.1002/0471739219.ch3. url: http://dx.doi.org/10.1002/0471739219.ch3.

Moussa, Mohamad and Marek Rychlik (2018). Efficient Error Correcting Codes for Dual-Disk Corruption. Submitted to USPTO as a document accompanying the non-provisional utility patent on Jan. 19, 2018; extended and updated version of the paper submitted on Jan. 24, 2017 with the provisional patent application.

Plank, James S. (1997). "A Tutorial on Reed-Solomon Coding for Fault-Tolerance in RAID-like Systems". In: Software—Practice & Experience 27.9, 995-1012.

Plank, James S. and Y. Ding (2005). "Note: Correction to the 1997 Tutorial on Reed-Solomon Coding". In: Software—Practice & Experience 35.2, 189-194.

Rozier, Eric W. D. et al. (2009). "Evaluating the impact of Undetected Disk Errors in RAID systems". English. In: 83-92. isbn: 9781424444229;1424444225.

Schonhage, Arnold and Volker Strassen (1971). "Schnelle Multiplikation groser Zahlen." In: Computing 7.3-4, 281-292. url: http://dblp.uni-trier.de/db/journals/computing/computing7.html#/SchonhageS71.

* cited by examiner

|  | $Stripe_1$ | $Stripe_2$ | $\cdots$ | $Stripe_{L-1}$ | $Stripe_L$ |
|---|---|---|---|---|---|
| $Disk_1$ | $Strip_{1,1}$ | $Strip_{1,2}$ | $\cdots$ | $Strip_{1,L-1}$ | $Strip_{1,L}$ |
| $Disk_2$ | $Strip_{2,1}$ | $Strip_{2,2}$ | $\cdots$ | $Strip_{2,L-1}$ | $Strip_{2,L}$ |
| $\vdots$ | $\vdots$ | $\vdots$ | $\ddots$ | $\vdots$ | $\vdots$ |
| $Disk_{N-1}$ | $Strip_{N-1,1}$ | $Strip_{N-1,2}$ | $\cdots$ | $Strip_{N-1,L-1}$ | $Strip_{N-1,L}$ |
| $Disk_N$ | $Strip_{N,1}$ | $Strip_{N,2}$ | $\cdots$ | $Strip_{N,L-1}$ | $Strip_{N,L}$ |

|  | $Stripe_1$ | $Stripe_2$ | $\cdots$ | $Stripe_{L-1}$ | $Stripe_L$ |
|---|---|---|---|---|---|
| $Disk_1$ | $D_{1,1}$ | $D_{1,2}$ | $\cdots$ | $D_{1,L-1}$ | $D_{1,L}$ |
| $Disk_2$ | $D_{2,1}$ | $D_{2,2}$ | $\cdots$ | $D_{2,L-1}$ | $D_{2,L}$ |
| $\vdots$ | $\vdots$ | $\vdots$ | $\ddots$ | $\vdots$ | $\vdots$ |
| $Disk_{N-1}$ | $D_{N-1,1}$ | $D_{N-1,2}$ | $\cdots$ | $D_{N-1,L-1}$ | $D_{N-1,L}$ |
| $Disk_N$ | $D_{N,1}$ | $D_{N,2}$ | $\cdots$ | $D_{N,L-1}$ | $D_{N,L}$ |

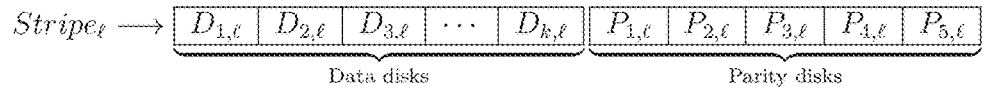

FIG. 3

Parity Matrix $$P_{5\times k} = \begin{bmatrix} 1 & 1 & \cdots & 1 & 1 \\ \alpha_1 & \alpha_2 & \cdots & \alpha_{k-1} & \alpha_k \\ \alpha_1^2 & \alpha_2^2 & \cdots & \alpha_{k-1}^2 & \alpha_k^2 \\ \alpha_1^3 & \alpha_2^3 & \cdots & \alpha_{k-1}^3 & \alpha_k^3 \\ \alpha_1^2 + \alpha_1 & \alpha_2^2 + \alpha_2 & \cdots & \alpha_{k-1}^2 + \alpha_{k-1} & \alpha_k^2 + \alpha_k \end{bmatrix}$$

34

Generator Matrix $$G_{(k+5)\times k} = \begin{bmatrix} 1 & 0 & \cdots & 0 & 0 \\ 0 & 1 & \cdots & 0 & 0 \\ \vdots & \vdots & \ddots & \vdots & \vdots \\ 0 & 0 & \cdots & 1 & 0 \\ 0 & 0 & \cdots & 0 & 1 \\ \hline 1 & 1 & \cdots & 1 & 1 \\ \alpha_1 & \alpha_2 & \cdots & \alpha_{k-1} & \alpha_k \\ \alpha_1^2 & \alpha_2^2 & \cdots & \alpha_{k-1}^2 & \alpha_k^2 \\ \alpha_1^3 & \alpha_2^3 & \cdots & \alpha_{k-1}^3 & \alpha_k^3 \\ \alpha_1^2 + \alpha_1 & \alpha_2^2 + \alpha_2 & \cdots & \alpha_{k-1}^2 + \alpha_{k-1} & \alpha_k^2 + \alpha_k \end{bmatrix}$$

35

Parity-Check Matrix $$H_{5\times(k+5)} = \left[ \begin{array}{ccccc|ccccc} 1 & 1 & \cdots & 1 & 1 & 1 & 0 & 0 & 0 & 0 \\ \alpha_1 & \alpha_2 & \cdots & \alpha_{k-1} & \alpha_k & 0 & 1 & 0 & 0 & 0 \\ \alpha_1^2 & \alpha_2^2 & \cdots & \alpha_{k-1}^2 & \alpha_k^2 & 0 & 0 & 1 & 0 & 0 \\ \alpha_1^3 & \alpha_2^3 & \cdots & \alpha_{k-1}^3 & \alpha_k^3 & 0 & 0 & 0 & 1 & 0 \\ \alpha_1^2 + \alpha_1 & \alpha_2^2 + \alpha_2 & \cdots & \alpha_{k-1}^2 + \alpha_{k-1} & \alpha_k^2 + \alpha_k & 0 & 0 & 0 & 0 & 1 \end{array} \right]$$

| Parity | | System of equations for $\rho$ | Constraints on $s$ | Non-Uniqueness condition |
|---|---|---|---|---|
| $j$ | $l$ | $\Gamma$ when $\rho$ known | $\Gamma$ when $\rho$ unknown | |
| 1 | 2 | $s_5 \rho + s_4 + s_3$ <br> $s_3 \rho + s_4$ | $s_4 s_5 + s_3 s_4 + s_3^2$ | $s_3 = s_5 = s_4 = 0$ |
| 1 | 3 | $s_2 \rho + s_5 + s_2$ <br> $s_5 \rho + s_5 + s_4 + s_2$ | $s_5^2 + s_2 s_4 + s_2^2$ | $s_2 = s_5 = s_4 = 0$ |
| 1 | 4 | $(s_5 + s_3) \rho + s_3$ | $s_5 + s_3 + s_2$ | $s_3 = s_2 = s_5 = 0$ |
| 1 | 5 | $s_2 \rho + s_3$ <br> $s_3 \rho + s_4$ | $s_2 s_4 + s_3^2$ | $s_2 = s_3 = s_4 = 0$ |
| 2 | 3 | $(s_5 + s_1) \rho + s_5 + s_4$ <br> $s_5 \rho^2 + s_4 \rho + s_4$ <br> $(s_5^2 + s_4 s_5) \rho + s_4^2 + s_1 s_4$ | $s_5^3 + s_1 s_4 s_5 + s_1 s_4^2 + s_1^2 s_4$ | $s_1 = s_4 = s_5 = 0$ |
| 2 | 4 | $s_1 \rho + s_5 + s_3$ <br> $(s_5 + s_3) \rho + s_3$ | $s_5^2 + s_3^2 + s_1 s_3$ | $s_1 = s_3 = s_5 = 0$ |
| 2 | 5 | $s_1 \rho^2 + s_3$ <br> $s_3 \rho + s_4$ <br> $s_1 s_4 \rho + s_3^2$ | $s_1 s_4^2 + s_3^3$ | $s_1 = s_3 = s_4 = 0$ |
| 3 | 4 | $s_1 \rho + s_2$ <br> $s_2 \rho + s_5 + s_2$ | $s_1 s_5 + s_2^2 + s_1 s_2$ | $s_1 = s_2 = s_5 = 0$ |
| 3 | 5 | $s_1 \rho + s_2$ <br> $s_2 \rho^2 + s_4$ <br> $s_2^2 \rho + s_1 s_4$ | $s_1^2 s_4 + s_2^3$ | $s_1 = s_2 = s_4 = 0$ |
| 4 | 5 | $s_1 \rho + s_2$ <br> $s_2 \rho + s_3$ | $s_1 s_3 + s_2^2$ | $s_1 = s_2 = s_3 = 0$ |

FIG. 12

| $j$ | System of equations for $\sigma_1$ and $\sigma_2$ | Constraint on $s$ | Non-Uniqueness Condition |
|---|---|---|---|
| 5 | $s_3 + \sigma_1 s_2 + s_1 \sigma_2$ <br> $s_4 + \sigma_1 s_3 + \sigma_2 s_2$ <br> $s_2 s_4 + s_3^2 + \sigma_2 (s_1 s_3 + s_2^2)$ | Empty | $s_1 = s_2 = s_3 = s_4 = 0$ |
| 4 | $\sigma_1 (s_5 + s_3) + s_3 + s_1 \sigma_2$ | $s_5 + s_3 + s_2$ | Typically non-unique |
| 3 | $s_5 + \sigma_1 s_2 + s_2 + s_1 \sigma_2$ <br> $\sigma_1 s_5 + s_5 + s_4 + \sigma_2 (s_2 + s_1) + s_2$ <br> $s_5^2 + \sigma_2 (s_1 s_5 + s_2^2 + s_1 s_2) + s_2 s_4 + s_2^2$ | Empty | $s_1 = s_2 = s_4$ and $s_5 = 0$ <br> Sol'n: $u_1 \neq 1$, $u_2 = u_1/(1 + u_1)$ <br> Note: $\sigma_1 = \sigma_2$ |
| 2 | $\sigma_2 (s_5 + s_3 + s_1) + \sigma_1 s_5 + s_4 + s_3$ <br> $\sigma_2 (s_5^2 + s_3 (s_3 + s_1)) + s_4 s_5 + s_3 s_4 + s_3^2$ <br> $\sigma_2 (s_5 + s_3) + s_4 + \sigma_1 s_3$ | Empty | $s_1 = s_3 = s_4$ and $s_5 = 0$ <br> Sol'n: $u_1 \neq 1$, $u_2 = u_1/(1 + u_1)$ <br> Note: $\sigma_1 = \sigma_2$ |
| 1 | $\sigma_2 (s_5 + s_3) + s_4 + \sigma_1 s_3$ | $s_5 + s_3 + s_2$ | Typically non-unique |

FIG. 13

| $j$ | Consistency condition |
|---|---|
| 1 | $s_2 + s_3 + s_5 = 0$ |
| 2 | $\sigma_2 (s_5 + s_3) + s_4 + \sigma_1 s_3 = 0$ |
| 3,4,5 | Empty |

FIG. 14

| $j$ | $l$ | Consistency condition | Degeneracy condition |
|---|---|---|---|
| 1 | 2 | $\sigma_2 (s_5 + s_3) + s_4 + \sigma_1 s_3$ | $s_4 s_5 + s_3 s_4 + s_3^2$ |
| 1 | 3 | $\sigma_1 (s_5 + s_2) + s_4 + s_2 \sigma_2$ | $s_5^2 + s_2 s_4 + s_2^2$ |
| 1 | 4 | 1 | 1 |
| 1 | 5 | $s_4 + \sigma_1 s_3 + s_2 \sigma_2$ | $s_2 s_4 + s_3^2$ |
| 2 | 3 | $\sigma_2 s_5 + \sigma_1^2 s_5 + \sigma_1 s_4 + s_4 + s_1 \sigma_2^2 + s_1 \sigma_1 \sigma_2$ | $s_5^3 + s_1 s_4 s_5 + s_1 s_4^2 + s_1^2 s_4$ |
| 2 | 4 | $\sigma_1 (s_5 + s_3) + s_3 + s_1 \sigma_2$ | $s_5^2 + s_3^2 + s_1 s_3$ |
| 2 | 5 | $\sigma_1 s_4 + \sigma_2 s_3 + \sigma_1^2 s_3 + s_1 \sigma_2^2$ | $s_1 s_4^2 + s_3^3$ |
| 3 | 4 | $s_5 + s_1 \sigma_2 + \sigma_1 s_2 + s_2$ | $s_1 s_5 + s_2^2 + s_1 s_2$ |
| 3 | 5 | $s_4 + s_2 \sigma_2 + s_1 \sigma_1 \sigma_2 + \sigma_1^2 s_2$ | $s_1^2 s_4 + s_2^3$ |
| 4 | 5 | $s_3 + s_1 \sigma_2 + \sigma_1 s_2$ | $s_1 s_3 + s_2^2$ |

FIG. 15

METHOD AND SYSTEM UTILIZING QUINTUPLE PARITY TO PROVIDE FAULT TOLERANCE

CROSS REFERENCE

This application is a continuation and claims benefit of U.S. patent application Ser. No. 16/521,256 filed Jul. 24, 2019, which is a continuation-in-part and claims benefit of PCT Application No. PCT/US18/14420 filed Jan. 19, 2018, and claims benefit of U.S. Provisional Patent Application No. 62/449,920 filed Jan. 24, 2017, the specification(s) of which is/are incorporated herein in their entirety by reference.

FIELD OF THE INVENTION

The present invention is generally related to error correction, more specifically to providing fault tolerance for data retrieved from storage devices or received after a transmission.

BACKGROUND OF THE INVENTION

A Redundant Array of Independent Disks (RAID) combines a plurality of physical disks managed by a RAID controller into a virtual disk for purposes of reliability, capacity or performance. In nested RAID, some of the disks comprising the array may be virtual.

As is well known, there are standard methods, referred to as RAID levels, one or more of which may be implemented in the RAID controller. They are RAID 0, RAID 1, RAID 3, RAID 4, RAID 5 and RAID 6. Two nested RAID levels, RAID 10 and RAID 60, are also known.

As is known, a technique called striping increases performance. Striping is implemented by dividing a sequence of data words into contiguous blocks called stripes, whereby data in each stripe are read from or written to strips (also called minor stripes) residing on different disks. No fault tolerance is provided by striping. The storage capacity of the virtual disk implemented by striping is the sum of the storage capacities of the individual disks comprising the array, resulting in high stor-age efficiency of 1. An example of RAID implementing striping is RAID 0. Another example is RAID 6, wherein striping is combined with fault tolerance using an error correcting code utilizing 2 parity strips per stripe. Striping in RAID 6 is typically combined with load balancing, i.e. distributing parity amongst the disks in the array for the purpose of evening out the disk wear, which may cause premature failure. Typically, load balancing is implemented by permuting the strips of each stripe be fore storing the stripe on disk, according to some deterministic rule. One method of implementing load balancing involves cyclically permuting the strips in a stripe. Load balancing is undone upon reading data from the disks, by restoring the original order of the strips. Generally, it will be apparent to those skilled in the art how to modify RAID architectures comprising striping to implement both striping and load balancing.

It is known how to increase fault tolerance by combining striping, redundancy and $[N, K, D]_Q$ linear, forward error correcting codes (FEC codes) over a Galois field GF (Q), were $Q=p^m$ with p being a prime number, and $m \geq 1$ being a whole number. The notation $[N, K, D]_Q$ refers to a code of length N, rank K and distance D, and over Galois field GF (Q) and the meaning of these terms is known to those skilled in the art. Q is often fixed and omitted, resulting in abbreviated notation [N, K, D]. For example, a RAID comprising N disks may be used to store data di-vided into vectors of length K over the Galois field GF ($2^m$) where K<N. Given a linear code of type [N, K, D], we may first encode a vector of length K as a vector of length N, and store different elements of the vector (symbols) on different disks comprising the array. For example RAID 6 may be implemented with m=8, whereby each Galois field element is identified with a byte. An example of RAID combining striping, redundancy and linear FEC code is RAID 6, which uses a systematic, linear code with 2 parity strips per stripe, typically called P and Q (*The Mathematics of RAID-6*, Anvin 2009). Thus, a sequence of K=N−2 bytes is encoded to N bytes, with each byte stored on a separate disk, with all N bytes stored at the same address. RAID 6 may use m l=8. Another example of RAID combining striping, redundancy and linear FEC code is RAID 5, using a single redundant symbol for each encoded block of data, the parity bit.

As is known, coding theory is focused on encoding, decoding, and transform-ing data divided into codewords, which are vectors of symbols. RAID implementing striping presents data to an error correcting method as stripes comprised of strips. Thus in the invention, stripes and strips are also called codewords and symbols, respectively.

An example of RAID using an error correcting code which is not a linear FEC code is RAID 1, combines striping with mirroring, wherein the repetition code is the error correcting code. As is known, repetition coding can be used to provide high fault tolerance. The drawback is low storage efficiency. For example, RAID 1 with N disks which are intended to be mirrors of each other, where N is sufficiently large and odd, can be used to recover from lN/2J errors by using the majority logic decoder, well known to those skilled in the art. RAID 1 with N disks with any N>1 tolerates up to N−1 erasures. For large N the storage efficiency of RAID 1 is 1/N.

In the past, standard RAID levels provided adequate fault tolerance and low cost in terms of computing resources. At present, the fault tolerance is inadequate due to increasing requirements and advances in physical storage.

One example of a new requirement is that RAID must provide error tolerance in the so called degraded mode, i.e. when operating without all disks comprising the array. Typically the degraded mode is entered when one of the disks fails or is deemed unreliable, and is replaced with a new replacement disk. The RAID controller takes a number of steps to restore the data on the failed disk. In the past, this process was relatively short as compared to the mean time to failure of a disk. At present, disk sizes have increased and RAID may be in degraded mode for days or weeks, which is significant. Also, RAID may comprise more disks, further decreasing mean time to failure of at least one of the disks. If a disk fails while RAID is in degraded mode, RAID enters doubly degraded mode, etc. As is well known to those skilled in the art, every failed disk adds one erasure to the errors that the error correcting code must handle. For example, RAID 6 tolerates 2 known erasures, and thus it does not suffer data loss by entering the doubly degraded mode. However, RAID 6 in doubly degraded mode is functionally equivalent to RAID 0, i.e. it loses its error detecting and correcting capabilities. Even in simple degraded mode (with 1 disk missing) RAID 6 is no longer able to correct errors at unknown locations.

At present, of all standard RAID levels, RAID 6 is still in common use for the purpose of providing fault tolerance, either as a standalone system, or as a component of nested RAID such as RAID 60. In the near future, RAID 6 will not be able to fulfill the growing requirements, thus ending the use of standard RAID levels ("Triple-Parity RAID and Beyond", Leventhal 2009).

Another example of a new requirement is recovery from Undetected Disk Errors (UDE). It is a bit error which is undetected by the disk controller. As a result, incorrect data is returned to the user, such as the operating system or the RAID controller. UDE leads to a type of data loss called "silent data loss" or "silent data corruption". The rate of UDE is known for mechanical disks. A bit of data stored on a mechanical disk may be read incorrectly approximately once per every $10^{14}$ read operations. As an example, RAID 0 comprising 10 mechanical disks may be written to or read from at a rate of 1 GB/sec or more, i.e. at least $8 \times 10^9 \approx 10^0$ bits per second. In $10^4$ seconds, i.e. approximately 3 hours, a bit error is expected to occur. This bit flip is not a result of a catastrophic failure or manufacturing defect but of laws of physics, and thus is virtually undetectable by the disk controller. Under similar conditions, in a single mechanical disk a random bit flip occurs on the average every 30 hours. In addition to theoretical estimates of the impact of UDE on storage integrity, there is experimental evidence confirming that a significant amount of data loss is undetected, i.e. is due to UDE ("An Analysis of Data Corruption in the Storage Stack", Bairavasundaram et al. 2008), ("Evaluating the impact of Undetected Disk Errors in RAID systems", Rozier et al. 2009). As is known, this type of data loss cannot be completely eliminated, but the rate of silent data loss can be reduced by utilizing stronger error correcting codes.

It is known how to increase fault tolerance so that UDE are tolerated. In the context of FEC code, two types of errors are distinguished: erasures (or known erasures) and errors. This terminology is unfortunate because it leads to confusion, especially when applied in the context of RAID which may use the term "error" differently. Instead of the term "erasure" or "known erasure" the term "disk failure at known location" or "error at known location" is used in the invention. What is important is that during decoding (recovery), the locations of the symbols in error are explicitly known. An example of an error at known location is the error resulting from a missing disk being reconstructed or permanently unavailable. All symbols corresponding to strips on the missing disks are treated as errors at known locations, i.e. known erasures. Instead of the term "error" we use the term "disk failure at unknown location" or "disk error at unknown location". An example of an error at an unknown location is UDE. The decoder may know that errors exist in the received message by performing a parity check. The decoder must not assume any particular position of symbols in error, as UDE is assumed to occur at a random location. The decoder may assume a limit on the number of such errors, which may allow determining their location and correct them.

One example of error location computation is provided by Reed-Solomon (RS) coding, which is a special case of polynomial oversampling coding, and is well known to those skilled in the art. The advantages and disadvantages of RS coding are known, as they have been in existence for 6 decades. They have been exten-sively studied. The state of the art has been a subject of a recent Ph.D. dissertation (*The Original View of Reed-Solomon Coding and the Welch-Berlekamp Decoding Al-gorithm*, Mann 2013). It is known how to implement RS codes in a RAID array controller. Reed-Solomon codes with rank K and length N are known to correct up to T=N-K (known) erasures and IT/2J errors (at unknown locations). It is also known how to correct a combination of E errors and Z erasures if the condition $Z+2 \times E \leq N-K$ is satisfied. This inequality is known to hold for all Maxi-mum Distance Separable (MDS) codes of type [N, K, N-K+1], such as RS code. Therefore, RAID based on RS codes retains the ability to correct errors in degraded modes if the number of disks being reconstructed is lower than N-K.

The main drawback of RS codes is related to performance. In the past and at present, RS codes have been extensively used for applications in which fault tolerance trumps the data rate in terms of requirements. One example of such an application is decoding compact disks. Another example is space communications, whereby digital images were sent from the Voyager spacecraft to Earth. Both examples are subjected to high level of noise, and thus high error rate, but not requiring extremely high data rates. Some regard RAID 6 error correcting code as a RS code, but for the purpose of the invention, RAID 6 error correcting code is considered distinct from RS codes. An example of the difference is that RS codes are not systematic and RAID 6 code is systematic. The advantage of systematic codes over non-systematic codes is that the input data are directly passed through the encoder. In contrast, non-systematic code subjects input data to a costly transformation comprising dense matrix multiplication. RS codes also require a time-consuming transformation upon decoding even in the absence of errors. Another drawback of RS codes is the use of Chien search or another technique to factor the error locator polynomial. The cost of the search is O(T×N), where T is the number of errors, and in particular grows with the number of disks in the RAID.

Examples of systematic FEC codes are known, wherein a Vandermonde matrix as a starting point of constructing the parity check matrix for the code. One example is the codes which use a matrix obtained by transforming the Vandermonde matrix using Gaussian elimination (column-reduction). ("A Tutorial on Reed-Solomon Coding for Fault-Tolerance in RAID-like Systems", Plank 1997; "Note: Correction to the 1997 Tutorial on Reed-Solomon Coding", Plank and Ding 2005; *Ac-celerated erasure coding system and method*, Anderson and Mann 2014; *The Original View of Reed-Solomon Coding and the Welch-Berlekamp Decoding Algorithm*, Mann 2013). As is known, these codes are sometimes called modified Reed-Solomon codes. One drawback of the embodiment described in (*Accelerated erasure coding system and method*, Anderson and Mann 2014) is that the decoder may require a large lookup table obtained by inverting a large number of matrices, large enough not to fit in the fast caches of modem CPU. In contrast, RS codes solve the decoding problem by reducing it to the problem of factorization of the error locator polynomial.

As is known, it is advantageous for a linear FEC code to have distance as large as possible. As it should be clear to those skilled in the art, [N, K, D] linear FEC code can correct E errors and Z (known) erasures if the condition $Z+2 \times E \leq D-1$ is satisfied. When the code is an MDS code, this inequality reduces to $Z+2 \times E \leq N-K$, which has already been mentioned in paragraph 14. As an example, a linear FEC code with distance D=5 can correct a combination of Z=2 (known) erasures and E=1 error (at unknown location). It can also correct 3 erasures. Thus, it can be used to implement RAID providing fault tolerance in doubly degraded mode, by being able to correct an error due to either the failure of another (the third) disk or an UDE.

As is known to those skilled in the art, to compare different methods it is necessary to quantify the computational complexity, especially time and space complexity. The complexity of a RAID method implementing striping typically is computed as the time or space required to encode/decode a single codeword, which is a stripe. In the invention we will follow this convention. As an example, RAID 6 requires a fixed number of Galois field operations (addition, multiplication, division, logarithm lookup) when decoding a received vector, not counting the computation of parities or syndromes. This correlates with the number of CPU cycles and the time required to decode a received vector. The number of operations does not depend on the number of disks in the array N.

Also, constant time access is assumed to array elements. However, as N increases, it is necessary to use a larger Galois field GF (Q) with Q>N. The number of bits B=⌈$\log_2(Q)$⌉ per Galois field element grows, thus requiring more time per Galois field operation. Addition, which is identical to XOR, is O(B). Multiplication has complexity O(B·log(B)·log(log(B))), according to the state of the art ("Schnelle Multiplikation großer Zahlen.", Schönhage and Strassen 1971). Being close to O(B), this kind of complexity is referred to as quasilinear time complexity. Thus, the time complexity of RAID 6 decoding is O(log(N)·log log(N)·log log log(N)) rather than constant, and will be called quasi-logarithmic in the invention. Some operations, such as solving a quadratic equation in GF (Q), where Q=$2^m$, require inverting a matrix with coefficients in GF (2) of size O(m). The complexity of matrix inversion is O($m^p$) where the best p≤3, and the best known value of p known today is p≈2.373. Thus, the complexity in terms of Q of solving quadratic equation is O(log(Q)p). It is possible to choose Q arbitrarily large, independently of the number of disks N, incurring large computational cost. With an optimal choice of Q, Q≤2×N and the computational cost is O(log(N)p). However, the matrix inversion for solving quadratic equation can be performed only once, with its result stored in a lookup table of size O($m^2$), thus not affecting run time, assuming lookup time O(1) or even O(log m), if binary search needs to be used. Thus, having an algorithm which performs a constant number of Galois field oper-ations, and solves a fixed number of quadratic equations, remains quasi-logarithmic in N.

It should be noted that calculating parities for FEC codes requires O(N) operations (N multiplications, N additions to add the results). However, as is known, the summation step on a parallel computer can be reduced to O(log(N)) by requiring N parallel processors and shared memory (PRAM). The N multiplications can be performed in parallel, in quasi-logarithmic time O(log(N)·log log(N)·log log log(N)). Therefore, if error correction can be performed in a fixed number of Galois operations (not depending onN), the overall algorithm remains quasi-logarithmic on a parallel computer with N processors.

What is needed is an error correcting code and a RAID architecture solving the problem of fault tolerance observing the requirements and eliminating the draw-backs of RAID architectures of the past. It is desirable for the error correcting code to be a linear, systematic FEC code. It is also desirable for the error correcting code to require a fixed number of Galois field operations, not depending on the number of disks in the array, and thus having quasi-logarithmic computational time complexity, thus overcoming the drawback of RS codes and other methods used in the past. It is also desirable for the error correcting code to be able to correct more errors than RAID 6. At the minimum, the error correcting code should correct two erasures and one error at an unknown location, to prevent data loss due to UDE when perform-ing simultaneous reconstruction of two disks. It is further desirable that the error correcting capability dimin- ishes gracefully with the number of erasures, i.e. when operating in degraded modes with an increasing number of disks. It is also desirable for the performance to degrade gracefully with the number of failed disks or UDE. It is further desirable to represent the locations of data by associating unique Ga-lois field elements with those locations and have methods finding error locations by solving algebraic equations, which is faster than brute force search. As demonstrated by some of the embodiments of the invention, this requires replacing the notion of the locator polynomial known to those skilled in the art with systems of nonlinear algebraic equations, which can be solved with methods of algebraic geometry.

The things that are needed will be put forth as solutions in the next section.

SUMMARY OF THE INVENTION

In some aspects, the present invention provides a method of calculating of parity data and also expresses coefficients $P_{j,i}$, of the parity data as a matrix P. In order to overcome the problem of increasing fault tolerance of RAID 6 and having efficient decoding, similar matrices were proposed in the past. Most notably, the matrix in ("A Tutorial on Reed-Solomon Coding for Fault-Tolerance in RAID-like Systems", Plank 1997) called Information Dispersal Matrix (IDM) was proposed:

$$M = \begin{bmatrix} 1 & 0 & \cdots & 0 & 0 \\ 0 & 1 & \cdots & 0 & 0 \\ \cdots & \cdots & \ddots & \cdots & \cdots \\ 0 & 0 & \cdots & 1 & 0 \\ 0 & 0 & \cdots & 0 & 1 \\ 1 & 1 & \cdots & 1 & 1 \\ \alpha_1 & \alpha_2 & \cdots & \alpha_{k-1} & \alpha_k \\ \alpha_1^2 & \alpha_2^2 & \cdots & \alpha_{k-1}^2 & \alpha_k^2 \\ \cdots & \cdots & \ddots & & \cdots \\ \alpha_1^p & \alpha_2^p & \cdots & \alpha_{k-1}^p & \alpha_k^p \end{bmatrix}. \quad (1)$$

Matrix M generalizes the matrix of RAID 6 (*The Mathematics of RAID-6*, Anvin 2009), where p=1 yields the matrix used in RAID 6 coding method. Over the period of several years, it remained unnoticed that the method based on matrix M in (1) has what was perceived as a fundamental flaw, because it was discovered that some submatrices of M are not invertible as required by the decoding method. Matrix M was abandoned, and in subsequent papers ("Note: Correction to the 1997 Tutorial on Reed-Solomon Coding", Plank and Ding 2005; *Accelerated erasure coding system and method*, Anderson and Mann 2014) a different matrix was proposed, based on column reduction of Vandermonde matrix. An application to RAID is based on this modification of the Vandermonde matrix was presented in (*Accelerated erasure coding system and method*, Anderson and Mann 2014; *The Original View of Reed-Solomon Coding and the Welch-Berfekamp Decoding Algorithm*, Mann 2013). The generator matrix G of the present invention adds a row to the matrix M in (1) constructed with p=3, such that the row is obtained by adding rows k+2 and k+3 of the matrix M. The surprising discovery in the course of research on this matrix and the associated systematic, linear FEC code is that the resulting code overcomes the problem of efficient, systematic coding with significantly higher fault tolerance than than RAID 6. By means of a mathematical proof it was demonstrated that the code has distance 5. In particular, the code of the invention is not a Maximum Distance Separable (MDS) code, which may have excluded it from the search for a good code by those skilled in the art. It can be further seen that many submatrices of the generator ma-trix G shown in FIG. 4 are non-invertible, with some 3-by-3 submatrices not being invertible, where 3 is significantly less than the distance of the code, thus making it even less likely that those skilled in the art would consider its utility. Despite these features, which in the past would be considered drawbacks, the utility of the matrix G is demonstrated by the embodiments of the invention. Additionally, the error code based on the generator matrix G can be more efficiently decoded in the decoding method of the present invention, by using a fixed number of Galois field operations, independent of the number of disks in the array. Upon examining of the method of the invention, an efficient decoder can be constructed because of the care taken to preserve the essential features of the Vandermonde matrix, in particular, to keep simple formulae for the coefficients $P_{j,i}$. The method of decod-ing of the present invention significantly improves upon the prior art by employing a plurality of non-linear steps comprising solving systems of algebraic equations in several variables, for achieving the efficiency of the decoding. It is surprising that the non-linear steps can be completed by solving algebraic equations in one variable only, and of degree not more than 3. By comparison, Reed-Solomon codes use a single non-linear step consisting of solving a single algebraic equation in one variable, but of higher degree. The use of several nonlinear steps solving systems of algebraic equations in several variable to achieve the efficient decoding is surprising, as the prior art would associate such a non-linear step with increasing computational complexity. For example, the computational complexity associated with solving a general system of polynomial equations in several variables is doubly exponential or at least polynomial, in the size of the system, making the general method based on such systems of polynomial equations impractical. It has been demonstrated that even for small degrees the computational complexity is still polynomial ("Polynomial Complexity of Solving Systems of Few Algebraic Equations with Small Degrees", Grigoriev 2013). By focusing on specific features of the non-linear systems in the present invention, it was discovered that the non-linear step can actually be per-formed very efficiently, leading to overall quasi-logarithmic computational complexity O(log (N)·log log(N)·log log log(N)) in the number of disks, when performed on a parallel computer with N processors. Such low computational complexity should be surprising and unexpected to those skilled in the art, who would expect linear complexity O(N) in the number of disks. The present invention discloses that the number of Galois field operations is independent of the number of disks, which has significant computational benefits. For example, in order to perform any common task, the time is typically expected to increase proportionally to the task size (e.g., linear complexity). Thus, for about 10000 disks, the size of the input increases by a factor 10000, and we would expect to take up 1000 times more time than for input of size 10. However, the inventors have recognized that it is possible to significantly reduce the computational time by using algorithms using logarithmic complexities. For example, the time it takes to decode a stripe, according to the present invention, is nearly proportional to the logarithm of the number of disks. More specifically, if we compare RAID with N disks to RAID with $N^2$ disks, $N^3$, disks, etc, the time it takes to decode a stripe of data will double for $N^2$, triple for $N^3$ and so on. Thus, increasing the number of disks from 10 to 100 will only double the time to decode the stripe; if we have RAID with 10000 disks, the time will only quadruple over 10 disks according to an embodiment of the present invention.

In order to overcome data loss due to simultaneous failure of multiple disks, a method and apparatus for distributing data among multiple networks, machines, drives, disk sectors, files, message packets, and/or other data constructs, henceforth called "disks" is disclosed.

In one aspect, the invention is an efficient method and apparatus for efficient error correction in data storage and computer related applications based on a systematic, linear forward error correcting (FEC) code of type [N, N–5, 5] employing Galois field arithmetic. The method comprises designating 5 symbols of a codeword as parity, providing storage loss 5/N. As is known, [N, K, D] code, the code can correct Z erasures and E errors at unknown locations if the inequality $$Z+2\times E \leq D-1$$

holds ("Linear Block Codes", Moon 2005). For the code in the invention this inequality is $$Z+2\times E \leq 4$$

implying that the method provides error tolerance of up to 2 errors at unknown locations, and up to 4 known erasures, and of some combinations of known erasures and errors at unknown locations. The pairs (Z, E) satisfying the inequality $Z+2\times E \leq 4$ are: (0, 0), (0, 1), (0, 2), (1, 0), (1, 1), (2, 0), (2, 1), (3, 0), (4, 0).

The method of the invention provides error tolerance of a significant fraction of 5 simultaneous erasures. Some other combinations of errors, wherein $Z+2\times E \geq 5$, are handled by narrowing the list of most likely error combinations to a small number, e.g. 2.

In another aspect, the invention provides a fault-tolerant distributed data storage and retrieval system that delivers data at high speed and low cost, with storage data rate of up to N times of the rate at which data can be stored the slowest data construct comprising the apparatus, and with retrieval data rate of up to N–5 times the retrieval data rate of the slowest data construct comprising the apparatus.

In yet another aspect, the invention provides a low cost RAID with a significantly higher fault tolerance than RAID 6, providing fault tolerance of up to 4 concurrent disk failures without data loss, such as failure of additional disk during reconstruction of another disk. Said RAID retained error correcting capability to correct Undetected Disk Errors (UDE) when in degraded modes with up to 2 concur-rently failed disks. Said RAID allows at least $2^m-2$ data disks to be connected to one controller when used with a Galois field GF ($2^m$). For example, when using bytes (elements of GF (256)) as symbols, RAID may comprise up to 259 disks (254 data disks and 5 parity disks) connected to one RAID controller. Said RAID provides high data rates by striping, with or without load balancing.

In yet another aspect, the invention provides an algebraic method of decod-ing of linear FEC codes, generalizing Reed-Solomon codes by allowing asymmetric treatment of error locators corresponding to different classes of symbols. One ex-ample of such asymmetric treatment is a systematic code wherein data symbols are divided into two groups, where one group is the data symbols and the other group is the parity symbols. The invention provides a method of decoding all linear FEC codes algebraically by solving systems of nonlinear polynomial equations.

We turn to certain calculations showing the advantage of FEC code of the invention in comparison with the widely used RAID 6 code. As is known, array error rate can be computed from the formula for the tail probability of a binomial distribution:

$$R_A = 1 - \sum_{J=0}^{F} \binom{N}{J} R^J \times (1-R)^{N-J}$$

where R represents the failure rate of said disks comprising the array and F is the number of failures the array tolerates. The RAID array in the invention has F=2 for errors at unknown locations (two-error tolerance), and F=4 for errors at known locations (four-error tolerance). For comparison, RAID level 6 has F=1 for errors at unknown locations (a single error tolerance) and F=2 for errors at known locations (two-error tolerance). As it is easily determined, $$R_A \approx \binom{N}{F+1} \times R^{F+1} \approx \frac{(N \times R)^{F+1}}{(F+1)!}$$

assuming N>>1 and N×R<<1, the latter assumption being generally satisfied and necessary for a RAID array to provide sufficient fault tolerance. It follows that for unknown location errors, the array error rate is lower by a factor of $$\frac{\frac{(N \times R)^2}{2!}}{\frac{(N \times R)^3}{3!}} = \frac{3}{N \times R} \gg 1.$$

for the RAID array in the invention than that of a RAID 6 array. This provides for the ability to manufacture significantly larger RAID arrays employing a single controller. As an example, the probability that a particular byte stored in the array will be read incorrectly upon retrieval due to an UDE is estimated at $$R = 1 - (1 - 10^{-14})^8 \approx 8 \times 10^{14} \approx 10^{-13}$$

wherein 8 represents the number of bits in a byte, the underlying Galois field is GF (256) and $10^{-14}$ represents the typical error rate for a single rotational hard disk. If the array has N=100 disks, the factor N×R≈$10^{-11}$. Hence, the probability of data loss is reduced by a factor of $$\frac{3}{N \times R} \approx 3 \times 10^{11}$$

by utilizing the array of the invention instead of a RAID 6 array. Similarly, the error rate of errors at known locations is reduced by a factor of $$\frac{20}{(N \times R)^2} \gg 1.$$

This is determined by studying the ratio:

$$\frac{\frac{(N \times R)^3}{3!}}{\frac{(N \times R)^5}{5!}} = \frac{20}{(N \times R)^2} \gg 1.$$

The probability of data loss due to failed disks at known locations decreases even more, by a factor of $20 \times 10^{22}$. Another comparison can be made by requiring that the array in the invention and RAID 6 array give the same error rates, but the number of disks in the arrays is $N_1$ and $N_2$, respectively. For errors at unknown locations we require $$\frac{(N_1 \times R)^3}{3!} = \frac{(N_2 \times R)^2}{2!}.$$

By solving the equation with respect to $N_1$ we obtain:

$$N_1 = \sqrt[3]{\frac{3 \times N_2^2}{R}}.$$

For example, a RAID 6 array comprising $N_2$=10 disks is comparable in terms of the probability of data loss to the array of the invention with $$N_1 \approx 300{,}000 = 3 \times 10^5$$

disks. While it is hard to imagine today an array of this many disks attached to a single controller, the reasoning demonstrates a great advantage of the array of the invention over RAID 6 array in applications with a much higher value of R, such as communications over a noisy communication channel. It should be noted that an array of the invention comprising $3 \times 10^5$ disks cannot be constructed over the field GF (256), but can be constructed with a Galois field GF ($2^{19}$) elements, as $2^{19}$=524, 288. While the rate R is slightly changed by this modification R=19×$10^{14}$<$10^{-12}$, this does not affect overall conclusions about the ability to use orders of magnitude more disks attached to a single raid controller that RAID 6, with comparable error rates, still estimating $N_1 \approx 10^5$. It is also insightful to estimate how much more noise can the array of invention tolerate, with the same number of disks N, but different error rates $R_1$ and $R_2$ for a single device, by requiring:

$$\frac{(N \times R_1)^3}{3!} = \frac{(N \times R_2)^2}{2!}.$$

Solving for $R_1$, we obtain $$R_1 = \sqrt[3]{\frac{3 \times R_2^2}{N}}.$$

For example, a RAID 6 array comprising rotational hard disks has $R_2$=10−13 and the array of the invention with the same number N=100 disks has $$R_1 \approx 6.7 \times 10 - 10$$

which is approximately 6, 700 higher. Therefore, the array of the invention with comparable error rate to the RAID 6 array can comprise devices with 6, 700 times higher error rate.

A method of encoding data for providing higher fault tolerance to an associated array of disks in subsequent decoding is provided. The array may store a plurality of identically sized logical or physical blocks of data, herein referred to as stripes. The method may include logically or physically partitioning each stripe into k≥1 identically sized strips, herein referred to as data strips, wherein each data strip stores a portion of the data blocks of an associated stripe, numbering the data strips in each stripe with whole numbers 1, 2, 3, . . . , k, and calculating parity data comprising five parity strips, distinct from the data strips, and numbered k+1, k+2, k+3, k+4 and k+5. The calculating may include selecting k non-zero distinct elements of a Galois field GF ($2^m$), denoted by $\alpha_1, \alpha_2, \ldots, \alpha_k$, and at most one root of a quadratic equation $\zeta^2+\zeta+1=0$ to be included in the elements, and calculating parity of each parity strip according to the formula $$P_{j,\ell} = \sum_{i=1}^{k} M_{j,i} \cdot D_{i,\ell}, \quad j = 1, 2, 3, 4, 5,$$

wherein j is a panty strip index, associated with parity strip numbered k+j in the associated stripe, and /J is a stripe index i of the associated stripe, and wherein $$M_{j,i}=\alpha_i^{j-1}$$

for j=1, 2, 3, 4, and where, $$M_{5,i}=\alpha_i \cdot (\alpha_i+1);$$

The method may additionally include extending each stripe of the plurality of stripes into an encoded stripe by combining k data strips and the five parity strips and comprising a total of k+5 strips to generate a plurality of encoded stripes. As such, the data strips may be unmodified and may be generated using a systematic coding of encoding data and storing the plurality of encoded stripes in the array of disks such that each strip of the associated encoded stripe may be stored in a unique disk in the array of disks. Each disk may store one strip from each encoded stripe, and order of the strips in each stripe can be optionally changed prior to storing to implement load balancing. In this way, the step of extending each stripe of the plurality of stripes by combining k data strips and the five parity strips may provide an enhanced fault tolerance. The subsequent decoding of the plurality of encoded stripes of data may include subjecting the plurality of encoded stripes to an error-generating process, the error-generating process comprising storage and retrieval of data from disks and data transmission over a noisy channel. The decoding may further include identifying and correcting combinations of errors at known and unknown locations in the plurality of encoded stripes of data, wherein most likely combinations of errors are given higher priority over less likely combinations of errors. The method may further include a syndrome decoding. Syndrome decoding may include calculating a plurality of syndrome vectors $s=(s_{j,i})_j^5$, $\ell =1, 2, \ldots, L$, according to formula:

$$s_{j,\ell} = \sum_{i=1}^{k} M_{j,i} \cdot r_{i,\ell} + r_{k+j,\ell}$$

wherein $r_{i, \ldots, s}$ denotes data retrieved from disk i and stripe $\ell$, for i=1, 2, . . . , k+5 and $\ell$ =1, 2, . . . , L, wherein L is the total number of stripes. The syndrome decoding may additionally include calculating elements of the Galois field, herein referred to as error locators, by performing arithmetical operations in the Galois field. The syndrome decoding may additionally include identifying error locations based on the error locators, wherein an error locator value equal to $\alpha_i$ for some i designates data strip with index i as a faulty strip, calculating error values, and reconstituting lost data in each faulty strip by calculating lost data from non-faulty strips. The method may additionally include identifying at most two faulty strips of data in each stripe retrieved, herein referred to as received vector, from the array of disks, wherein the identifying does not require prior knowledge of a location or content of the faulty strips in the received vector. As such, the identifying may further include calculating two or more syndromes and syndrome ratios for the received vector to identify the at most two faulty strips of data, and reconstituting lost data in the faulty strips in the received vector by calculating said lost data from non-faulty strips comprising the associated stripe, wherein the method provides fault tolerance due to a combination of at most two errors at known or unknown locations. The method may additionally include computing a location of the faulty strips with unknown locations, and calculating lost data from non-faulty strips and reconstituting the lost data in the plurality of faulty strips of the received vector, wherein each stripe contains Z faulty strips at known locations, and E faulty strips at unknown locations, and wherein Z and E are nonnegative whole numbers such that Z+2×E≥4. As such, the number of Galois field operations may be independent of the number of disks in the array. The method may further include list decoding whereby a listing of most likely error vectors is produced for a given syndrome vector, in an order of decreasing likelihood. A complete listing of all of the most likely error vectors may be produced for each syndrome vector, for which said complete listing of all of the most likely error vectors includes at most two error vectors and the number of Galois field operations may be independent of the number of disks in the array. The method may additionally include providing fault tolerance of up to five errors by collecting lists of most likely error vectors from multiple stripes, and using the lists to reconstitute the lost data. As such, providing the fault tolerance may include searching for multiple stripes where the lists of error vectors share a set of common error locations, identifying locations of errors in said multiple stripes at the set of common error locations, and reconstituting lost data in said multiple stripes. Each stripe may contain up to three faulty data strips, and none of the faulty parity strips. The method may additionally include listing up to two possible error locations for one data error at an unknown location. Each stripe may contain four faulty strips and two of the faulty strips may be data strips at known locations, a third strip may be a data strip at an unknown location, and a fourth strip may be a parity strip at a known location. A second example embodiment of the present invention includes a method of encoding data logically or physically partitioned into a plurality of identically sized data blocks called stripes. The said method may include logically or physically partitioning each stripe into k≥1 identically sized strips, herein referred to as data strips, wherein each data strip stores a portion of the data blocks of an associated stripe, and numbering the data strips in each stripe with whole numbers 1, 2, 3, . . . , k. The method may additionally include calculating parity data comprising five parity strips, distinct from the data strips, and numbered k+1, k+2, k+3, k+4 and k+5. As such, the calculating may include selecting k non-zero distinct elements of a Galois field GF ($2^m$), denoted by $\alpha_1, \alpha_2, \ldots, \alpha_k$, and calculating parity of each parity strip according to the formula $$P_{j,\ell} = \sum_{i=1}^{k} M_{j,i} \cdot D_{i,\ell}, \quad j = 1, 2, 3, 4, 5.$$

The method may additionally include providing fault tolerance of up to five errors by collecting lists of most likely error vectors from multiple stripes, and using the lists to reconstitute the lost data. As such, providing the fault tolerance may include searching for multiple stripes where the lists of error vectors share a set of common error locations, identifying locations of errors in said multiple stripes at the set of common error locations, and reconstituting lost data in said multiple stripes. Each stripe may contain up to three faulty data strips, and none of the faulty parity strips. The method may additionally include listing up to two possible error locations for one data error at an unknown location. Each stripe may contain four faulty strips and two of the faulty strips may be data strips at known locations, a third strip may be a data strip at an unknown location, and a fourth strip may be a parity strip at a known location.

A second example embodiment of the present invention includes a method of encoding data logically or physically partitioned into a plurality of identically sized data blocks called stripes. The said method may include logically or physically partitioning each stripe into k≥1 identically sized strips, herein referred to as data strips, wherein each data strip stores a portion of the data blocks of an associated stripe, and numbering the data strips in each stripe with whole numbers 1, 2, 3, . . . , k. The method may additionally include calculating parity data comprising five parity strips, distinct from the data strips, and numbered k+1, k+2, k+3, k+4 and k+5. As such, the calculating may include selecting k non-zero distinct elements of a Galois field GF ($2^m$), denoted by $\alpha_1, \alpha_2, \ldots, \alpha_k$, and calculating parity of each parity strip according to the formula $$P_{j,\ell} = \sum_{i=1}^{k} M_{j,i} \cdot D_{i,\ell}, \quad j = 1, 2, 3, 4, 5,$$

where j is a parity strip index, associated with parity strip numbered k+j in the associated stripe, and is a stripe index of i the associated stripe, and where $M_{j,i} = \alpha_i^{j-1}$ for j=1, 2, 3, 4, and where, $M_{5,i} = \alpha_i \cdot (\alpha_i + 1);$ The method may additionally include extending each stripe of the plurality of stripes into an encoded stripe by combining k data strips and the five parity strips and comprising a total of k+5 strips to generate a plurality of encoded stripes, wherein the data strips are unmodified and generated using a systematic coding of encoding data. A third example embodiment of the present invention includes a system of encoding data for providing higher fault tolerance to an associated array of disks in subsequent decoding, said array storing a plurality of identically sized logical or physical blocks of data, herein referred to as stripes. The system may include one or more processors, and a memory coupled to the one or more processors, the memory to store computer-executable instructions that, when executed by the one or more processors, cause the one or more processors to perform operations including logically or physically partitioning each stripe intok≥1 identically sized strips, herein referred to as data strips, wherein each data strip stores a portion of the data blocks of an associated stripe, and numbering the data strips in each stripe with whole numbers 1, 2, 3, . . . , k. The one or more processors of the system may additionally calculate parity data comprising five parity strips, distinct from the data strips, and numbered k+1, k+2, k+3, k+4 and k+5. As such, the calculating may include selecting k non-zero distinct elements of a Galois field GF ($2^m$), denoted by $\alpha_1, \alpha_2, \ldots, \alpha_k$, and calculating parity of each parity strip according to the formula $$P_{j,\ell} = \sum_{i=1}^{k} M_{j,i} \cdot D_{i,\ell}, \quad j = 1, 2, 3, 4, 5,$$

wherein j is a parity strip index, associated with parity strip numbered k+j in the associated stripe, and /J is a stripe index of the associated stripe, and wherein $M_{j,i} = \alpha_i^{j-1}$ for j=1, 2, 3, 4, and where, $M_{5,i} = \alpha_i \cdot (\alpha_i + 1)$ The calculating may additionally include extending each stripe of the plurality of stripes into an encoded stripe by combining k data strips and the five parity strips and comprising a total of k+5 strips to generate a plurality of encoded stripes, wherein the data strips are unmodified and generated using a systematic coding of encoding data; and storing the plurality of encoded stripes in the array of disks such that each strip of the associated encoded stripe is stored in a unique disk in the array of disks, wherein each disk stores one strip from each encoded stripe, and wherein an order of the strips in each stripe can be optionally changed prior to storing to implement load balancing. As such, the step of extending each stripe of the plurality of stripes by combining k data strips and the five parity stripes provides an enhanced fault tolerance. The subsequent decoding of the plurality of encoded stripes of data may include subjecting the plurality of encoded stripes to an error-generating process, the error-generating process comprising storage and retrieval of data from disks and data transmission over a noisy channel. The decoding may include identifying and correcting combinations of errors at known and unknown locations in the plurality of encoded stripes of data, wherein most likely combinations of errors are given higher priority over less likely errors. The subsequent decoding may further include a syndrome decoding, wherein the syndrome decoding may include calculating a plurality of syndrome vectors $s=(s_{j,l})_{j-1}^{5}$, $\ell = 1, 2, \ldots, L$, according to formula:

$$s_{j,\ell} = \sum_{i=1}^{k} M_{i,j} \cdot r_{i,\ell} + r_{k+j,\ell}$$

wherein $r_{i,e}$ denotes data retrieved from disk i and stripe $\ell$, for i=1, 2, . . . ,k+5 and $\ell =1, 2, \ldots, L$, wherein L is the total number of stripes and calculating $\ell$ elements of the Galois field, herein referred to as error locators, by performing arithmetical operations in the Galois field. The subsequent decoding may additionally include identifying error locations based on the error locators, wherein an error locator value equal to $\alpha_i$ for some i designates data strip with index i as a faulty strip, calculating error values, and reconstituting lost data in each faulty strip by calculating lost data from non-faulty strips. The memory may include additional instructions that, when executed by the one or more processors, cause the one or more processors to perform operations including identifying at most two faulty strips of data in each stripe retrieved, herein referred to as received vector, from the array of disks, wherein the identifying does not require prior knowledge of a location or content of the faulty strips in the received vector, the identifying further comprising calculating two or more syndromes and syndrome ratios for the received vector to identify the at most two faulty strips of data. The one or more processors may additionally reconstitute lost data in the faulty strips in the received vector by calculating said lost data from non-faulty strips including the associated stripe, wherein the operation provides fault tolerance due to a combination of at most two errors at known or unknown locations. The one or more processors may additionally compute a location of the faulty strips with unknown locations, and calculate lost data from non-faulty strips and reconstitute the lost data in the plurality of faulty strips of the received vector, wherein each stripe contains Z faulty strips at known locations, and E faulty strips at unknown locations, and wherein Z and E are nonnegative whole numbers such that Z+2×E≥4, wherein the number of Galois field operations is independent of the number of disks in the array. The memory may include additional instructions that, when executed by the one or more processors, cause the one or more processors to perform operations including performing list decoding comprising producing a listing of most likely error vectors for a given syndrome vector, in an order of decreasing likelihood, and producing a complete listing of all of the most likely error vectors for each syndrome vector, for which said complete listing of all of the most likely error vectors comprises at most two error vectors, wherein the number of Galois field operations is independent of the number of disks in the array. Each stripe may contain up to three faulty data strips, and none of the faulty parity strips. The memory may include additional instructions that, when executed by the one or more processors, cause the one or more processors to perform operations including listing up to two possible error locations for one data error at unknown location, wherein each stripe contains four faulty strips, wherein two of the faulty strips may be data strips at known locations, a third strip may be a data strip at an unknown location, and a fourth strip may be a parity strip at a known location.

The invention accordingly comprises the several steps and the relation of one or more of such steps with respect to each of the others, and the apparatus embodying features of construction, combinations of elements and arrangement of parts that are adapted to affect such steps, all is exemplified in the following detailed disclosure, and the scope of the invention will be indicated in the claims.

BRIEF DESCRIPTION OF THE DRAWINGS

The features and advantages of the present invention will become apparent from a consideration of the following detailed description presented in connection with the accompanying drawings in which:

FIG. 3 is a schematic drawing of a storage array comprising stripes, strips and disks. A schematic drawing of a storage array logically or physically partitioned into N disks and L stripes, with N strips of data per stripe, and L strips of data per disk. The bottom drawing names the data in the strip $Strip_{i,\ldots,e}$, by $D_{i,e}$, where i is the disk index and /J is the stripe index, /J=1, 2, . . . , L. When disks are divided into k data disks and 5 parity disks, an alternative name, $P_{i,\ldots,e}$, instead of $D_{k+1,e}$, is defined for i=1, 2, 3, 4, 5.

FIG. 4 is the diagram showing the invented error correcting code comprising parity matrix [34], generator matrix [35], and parity check matrix [36].

FIG. 12 is a table listing the formulae for correcting a 3-error combination, one data and 2 parity errors at positions j, l (i.e. locations k+j, k+l), j, l=1, 2, 3, 4, 5, j<l. The equations (polynomials required to be 0) in the third column contain the data error locator p. The fourth column contains a constraint obtained by eliminating p from equations in column 2. The fifth column contains a non-uniqueness condition, which is the condition to have multiple 3-error combinations matching the syndromes $s_j$, j=1, 2, 3, 4, 5. As is clear, the non-uniqueness condition is satisfied only if the syndromes at positions other than j, l are zero. Therefore non-uniqueness is only possible when the syndromes match a 2-parity error.

FIG. 13 is a table listing the formulae for correcting a 3-error combination, consisting of 2 data errors and 1 parity error at position j (i.e. location k+j) j=1, 2, 3, 4, 5, occurs. The equations (polynomials required to be 0) in the second column are expressed in terms of symmetric polynomials $\sigma_1=u_1+u_2$ and $\sigma_2=u_1 \cdot u_2$, where $u_1$ and $u_2$ are the error locators of the 2 data errors.

FIG. 14 is a table listing the formulae for correcting a 4-error combination, consisting of 3 data errors and 1 parity error at position j (i.e. location k+j) j=1, 2, 3, 4, 5, occurs. The equation in the second column (a polynomial required to be 0) is a condition on the syndromes $s_j$ and data error locators $u_1$, $u_2$ and $u_3$ to have a solution with one parity error at position j, written in terms of the elementary symmetric polynomials $\sigma_1=u_1+u_2+u_3$ and $\sigma_2=u_1\,u_2+u_1\,u_3+u_2\,u_3$.

FIG. 15 is a table listing the formulae for correcting a 4-error combination, consisting of 2 data errors and 2 parity errors at positions j and l (i.e. locations k+j and k+l) j, l=1, 2, 3, 4, 5. The equation in the third column (a polynomial required to be 0) is a condition on the syndromes $s_j$ to have a solution with error locators $u_1$ and $u_2$ and parity errors at position j and l, written in terms of the symmetric polynomials $\sigma_1=u_1+u_2$ and $\sigma_2=u_1\,u_2$. The degeneracy condition (not to be confused with non-uniqueness condition) in the last column is a condition for the equation expressing conditions to have more than 2 solutions. It should be note there are no non-uniqueness conditions, i.e. non-uniqueness is automatic for such a combination of errors (Y=ø).

DETAILED DESCRIPTION OF THE PREFERRED EMBODIMENTS

Referring now to FIGS. 1-16, the present invention features a method for providing fault tolerance to an array of disks storing a plurality of stripes, where a stripe comprises a block of data. In some embodiments, each disk may be partitioned with several identically sized data partitions known as strips. Generally, each strip represents a fixed quantity of data. The data does not need to be binary, but it must be possible to interpret the content of every strip as an element of a Galois field GF ($2^m$), where m is a whole, positive number, and not depending on the disk index or stripe index.

Figure 1:
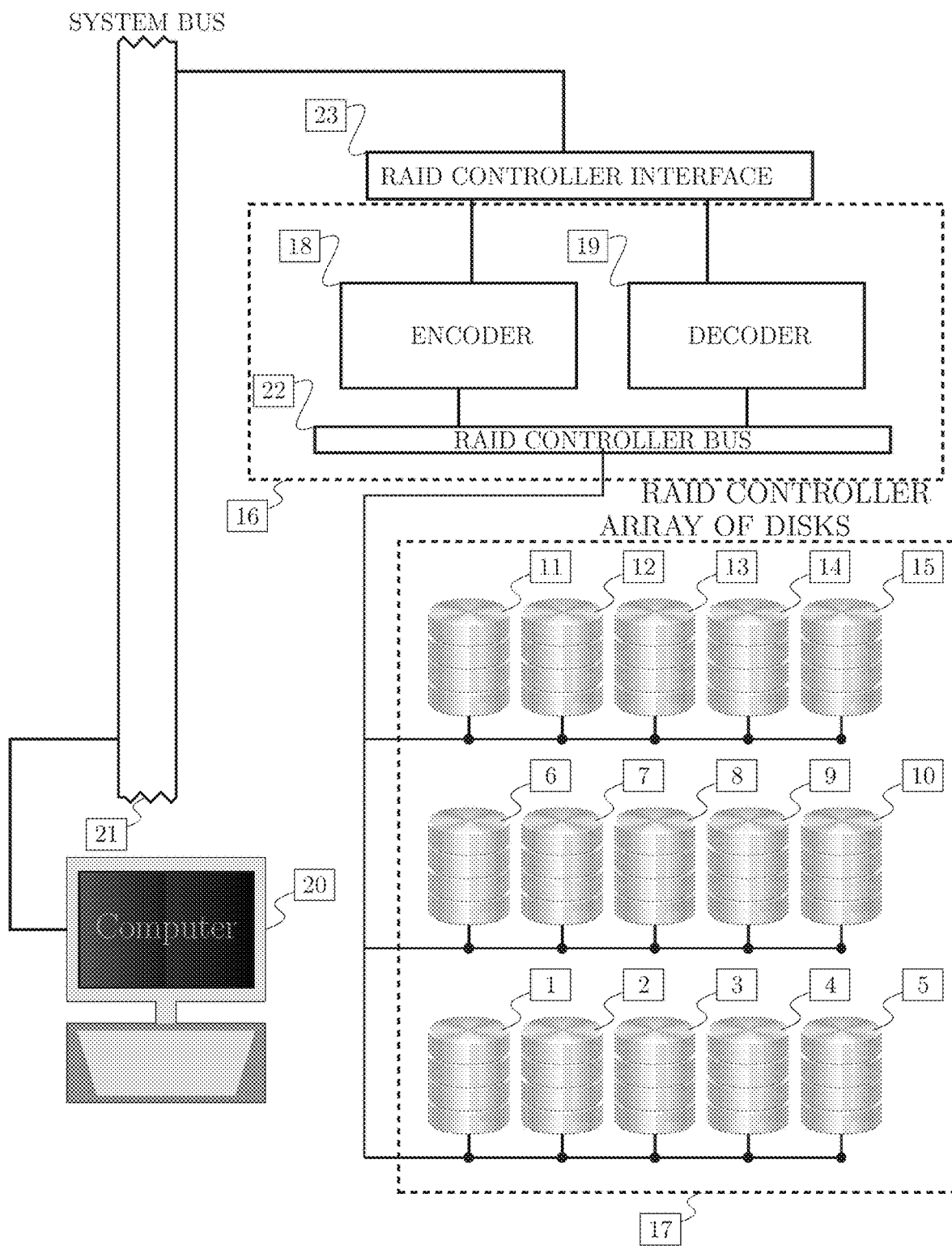
FIG. 1 is a schematic drawing of a system comprising an array of disks [17] comprising disk 1 of plurality of disks [1], disk 2 of plurality of disks [2], . . . , disk 15 of plurality of disks [15], managed by an RAID array controller [16] and attached to a computer [20], further comprising the following: encoder [18], decoder [19], computer system bus [21], RAID controller bus [22], RAID controller interface [23].

The drawing in FIG. 1 shows an exemplary arrangement of a preferred embodiment, comprising the RAID array controller [16] connected to the computer system bus [21] of the computer [20], and connected to an array of disks, comprising the array of disks [17] consisting of disk 1 of plurality of disks [1], disk 2 of plurality of disks [2], . . . , disk 15 of plurality of disks [15], wherein the number of disks is chosen as an example and can be changed to any number of disks at least equal to or greater than 6. The invention focuses on two processes, generally known as encoding and decoding. Said encoding comprises sending data from the computer [20] through the computer system bus [21] and through the RAID controller interface [23] to the encoder [18], wherein the data is processed in blocks called stripes, further divided into strips. The encoder adds 5 parity strips to the data stripe, thus forming the encoded stripe, and transmits said encoded stripe by means of the RAID controller bus [22] to the disks comprising the array, wherein the encoded stripe is divided into 15 strips by demuxing (demultiplexing), so that individual strips are stored on distinct disks. Said decoding comprises sending a request for data from the computer [20] to the RAID array controller [16], and to the disks in an array of disks [17]. The disks forward the requested data and the associated parity data to the decoder, wherein they are combined by multiplexing data strips coming from distinct disks into encoded stripes. The decoder [19] corrects the errors in encoded stripes, discards the parity data and transmits the data portion of the decoded and error-corrected stripe to the computer [20].

Figure 2:
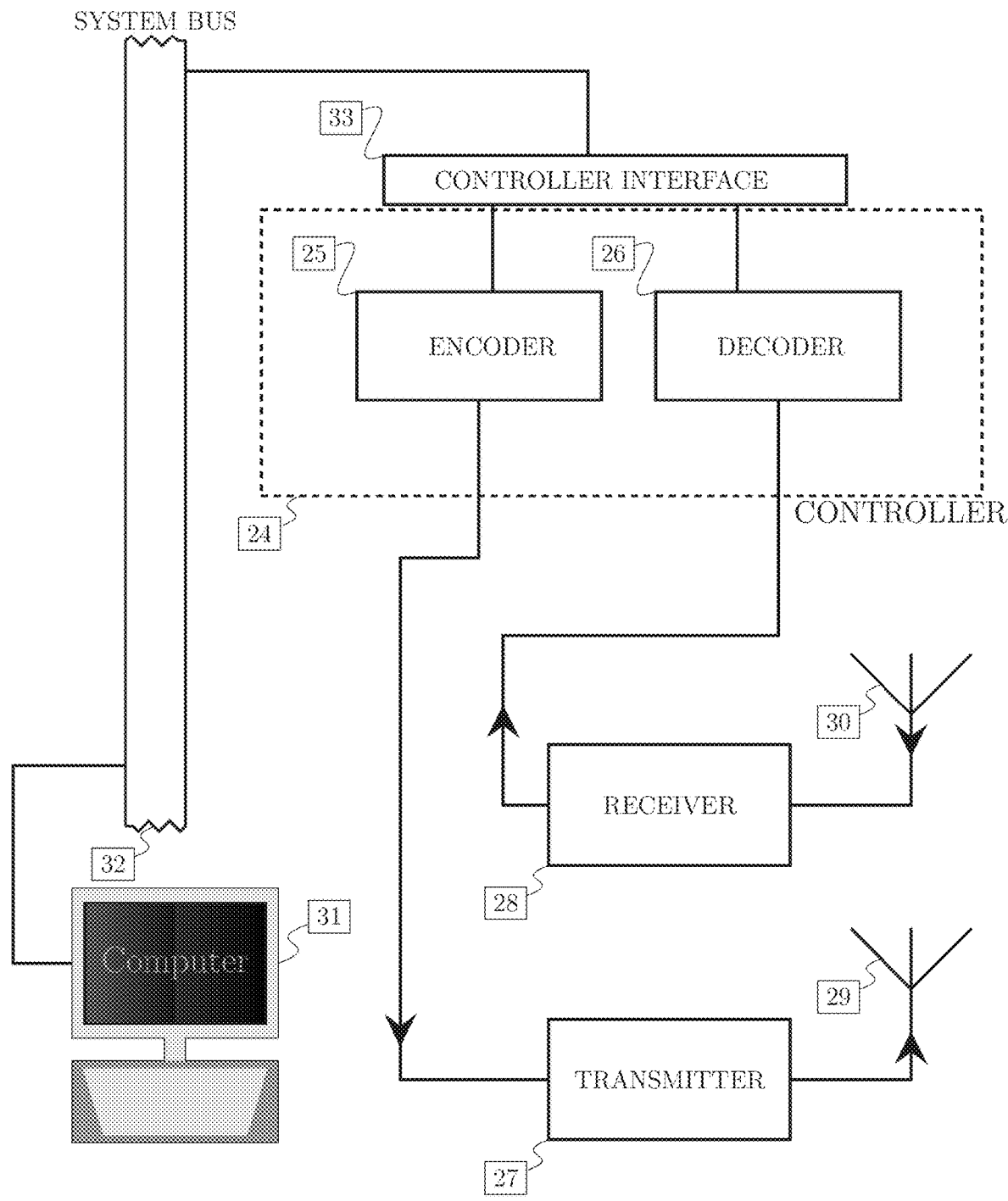
FIG. 2 is a schematic drawing of a communication system comprising communications controller [24] attached to a computer [31], transmitter [27] and a receiver [28], further comprising the following: encoder [25], decoder [26], transmitter antenna [29], receiver antenna [30], computer system bus [32], controller interface [33].

The drawing in FIG. 2 shows an exemplary arrangement of a preferred em-bodiment, comprising the communications controller [24] connected to the computer system bus [32] of the computer [31], wherein the communications controller [24] is connected to the transmitter [27] and to the receiver [28]. Said exemplary arrange-ment is a modification of the exemplary arrangement in FIG. 1, wherein the RAID controller bus [22] and the array of disks [17] were replaced with the transmitter [27] connected to encoder [25], and the receiver [28] connected to the decoder [26]. No multiplexing or demultiplexing of the data is required, i.e. what is being transmitted is a stream of data comprising stripes of data. Having at least two instances of the apparatus shown in FIG. 2 allows bidirectional, fault tolerant communications, wherein the signal originated by computer [31] and transmitted by transmitter an-tenna [29] in the first instance of the apparatus is subsequently received by receiver antenna [30] in the second instance of the apparatus, subsequently decoded in the decoder [26] and received by computer [31] in the second instance of the apparatus. A variant may replace the transmitter antenna [29] and the receiver antenna [30] with any type of stream- or packet-oriented communication channel, such as a wired connection.

We now turn again to FIG. 1. Conceptually distributed across the array of disks [17] in rows, the identically sized partitioned strips form a data stripe across the entire array of disks. Therefore, the array contains stripes of data distributed as rows in the array, wherein each disk is partitioned into strips of identically partitioned data and only one strip of data is associated with each stripe in the array. Each of the plurality of strips may be indexed by both disk and stripe. The data in strip $\text{Strip}_{i,\ell}$ will be called $D_{i,\ell}$, where i is the disk index, and $\ell$ is the stripe index. When a process operates on a single stripe, $\ell$ is fixed, and it may be dropped for the reason of simplicity of notation. Thus Data in stripe $$\text{Stripe}_\ell = (D_{1,\ell}, D_{2,\ell}, \ldots, D_{N,\ell}) = (D_1, D_2, \ldots, D_N) = \begin{bmatrix} D_{1,\ell} \\ D_{2,\ell} \\ \vdots \\ D_{N,\ell} \end{bmatrix} = \begin{bmatrix} D_1 \\ D_2 \\ \vdots \\ D_N \end{bmatrix}$$

where N is the number of disks in the array, and the second notation is preferred when the stripe index $\ell$ is obvious. The data in the stripe $\text{Strip}\ell$ is understood as a column vector in the N-dimensional vector space over the Galois field GF (2m). In the present invention, each stripe of the plurality of stripes is extended such that each stripe comprises the block of data associated with said stripe and a set of parity data comprising five parity strips. The array of disks may be divided into k data disks, to which data is written unmodified, and 5 parity disks, to which the computed parity data is written. For this reason, the last 5 disks are distinguished as parity disks, and refer to the data in their strips as $P_{i,\ell}$ instead of $D_{k+1,\ell}$, for i=1, 2, 3, 4, 5. The parity of each parity strip is calculated according to $$P_{j,\ell} = \sum_{i=1}^{k} M_{j,i} \cdot D_{i,\ell}, \quad j = 1, 2, 3, 4, 5, \quad (2)$$

where j is the parity disk index and f is the stripe index, and where $$M_{j,i} = \alpha_i^{j-1}$$

for j=1, 2, 3, 4, i=1, 2, . . . , k, and where, $$M_{5,i} = \alpha_i \cdot (\alpha_i + 1), i=1, 2, \ldots, k.$$

The equivalent form of equation (2) is $$s = H \cdot r \quad (3)$$

and it represents s as a matrix product of the parity matrix [34] and vector r=($D_1 \ldots \ell, D_2 \ldots \ell, \ldots, D_{k+5,\ell}$) called the received vector, and containing the data of stripe numbered $\ell$. The term "sent vector" refers to data that were most recently written to the same locations. The sent vector r=($D'_{1,\ell}, D'_{2,\ell}, \ldots, D'_{k+5,\ell}$), which may be different from the received vector due to errors. The differencee=r−r is henceforth called the "error vector".

Figure 5:
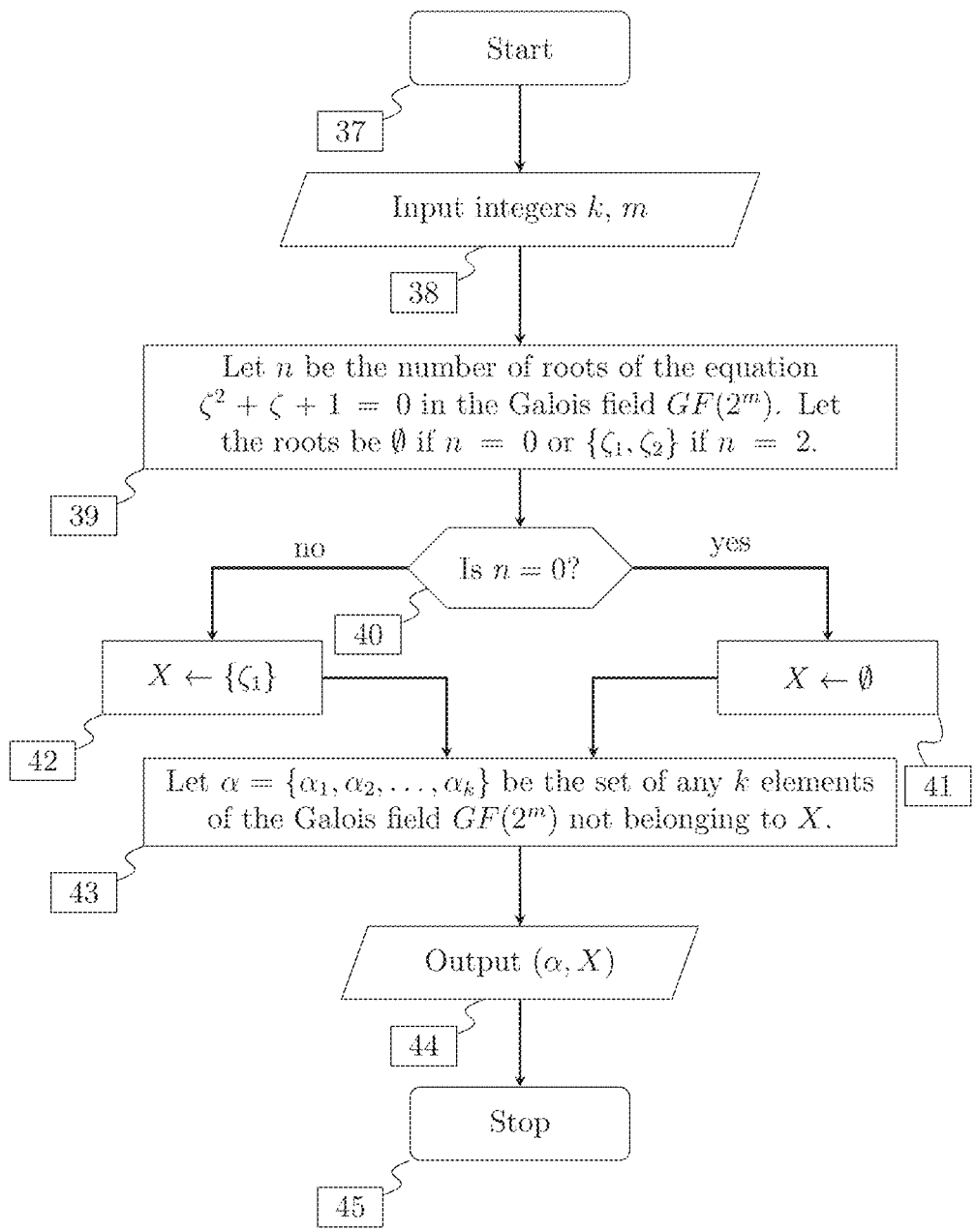
FIG. 5 is a schematic flow diagram of a method of creating the quintuple parity code, in particular, a subset a of the Galois field used in creating the parity matrix, the generator matrix and the parity check matrix, comprising the code cre-ation starting step [37], input of the number of data disks k and the parameter m defining the Galois field GF ($2^m$) step [38], assignment of the number of roots of the quadratic equation to n step [39], comparison of the number of roots of the quadratic equation n to 0 step [40], assignment of the empty set to the set of excluded roots of unity X step [41], assignment of a set consisting of a single root to the set of excluded roots X step [42], assignment of the set of selected elements of the Galois field GF ($2^m$) to variable a step [43], output of the set of the selected elements of the Galois field a and the set of excluded roots of unity X step [44], end of the method of creating of the quintuple parity code step [45].

The flowchart in FIG. 5 clarifies the method of selecting elements $\alpha_1, \alpha_2, \ldots, \alpha_k$ from the Galois field GF ($2^m$), satisfying all aforementioned requirements.

In additional embodiments, a method of recovering data in at most 5 faulty strips of data in each stripe retrieved ("received vector") from the array of disks is presented, said method further comprising a method for identifying at most two faulty strips, wherein said identification method does not require prior knowledge of a location or content of a faulty strip in the received vector, the identification method comprises calculating two or more syndromes and syndrome ratios for the received vector to identify the at most two faulty strips of data, wherein each syndrome, s, is calculated from:

$$s_{j,\ell} = \sum_{i=1}^{k} M_{i,j} \cdot r_{i,\ell} + r_{k+j,\ell} \quad (4)$$

wherein $r_{i \ldots e}$ denotes data retrieved from disk i and stripe $\ell$, for i=1, 2, . . . , k+5 and $\ell$ =1, 2, . . . , L, wherein L is the total number of stripes. Equation (4) is consistent with equations (2) and (3).

The drawing in FIG. 4 shows an exemplary arrangement of a preferred embodiment. In FIG. 4 one sees the parity matrix [34] which is the object of the current invention. Using the parity matrix [34], two additional matrices may be represented: the generator matrix [35] and the parity check matrix [36], related to the parity matrix by arranging parity matrix [34] and the identity matrices $1_{k \times k}$ and $1_{5 \times 5}$ by either stacking them together, or placing them side by side, as indicated by the following abbreviated equations:

$$G = \begin{bmatrix} I_{k \times k} \\ P_{5 \times k} \end{bmatrix}, H = [P_{5 \times k} \mid I_{5 \times 5}]. \quad (5)$$

The subscripted, Greek symbols $\alpha_1, \alpha_2, \ldots, \alpha_k$ represent member elements of the Galois field GF (2m), where m is any whole number, such as 1, 2, and so on. The whole number k represents the number of data disks comprising the RAID array. The elements $\alpha_j$ must be distinct and non-zero. As the Galois field has 2m elements, usually numbered 0, 1, 2, . . . , $2^m-1$, this imposes a requirement that $1 \leq k \leq 2^m-1$. Furthermore, we require that at most one of the elements $\alpha_j$ satisfies the quadratic equation $$\zeta^2 + \zeta + 1 = 0 \quad (6)$$

with an unknown quantity $\zeta$, ranging over the Galois field GF ($2^m$). Depending on m, either equation (6) has no solutions or it has two roots, which we call $\zeta_1$ and $\zeta_2$. Vieta's equations imply that $\zeta_1 + \zeta_2 = 1$ and $\zeta_1 \cdot \zeta_2 = 1$. Hence, both $\zeta_1$ and $\zeta_2$ are non-zero and distinct. Additionally, the roots of equation 6 are also the roots of the equation $\zeta^3 = 1$, also called the cubic roots of unity. It follows that k may be further limited to the range $1 \leq k \leq 2^m - 2$. As an example, in GF (256), i.e. when m=8, $1 \leq k \leq 254$.

Figure 6:
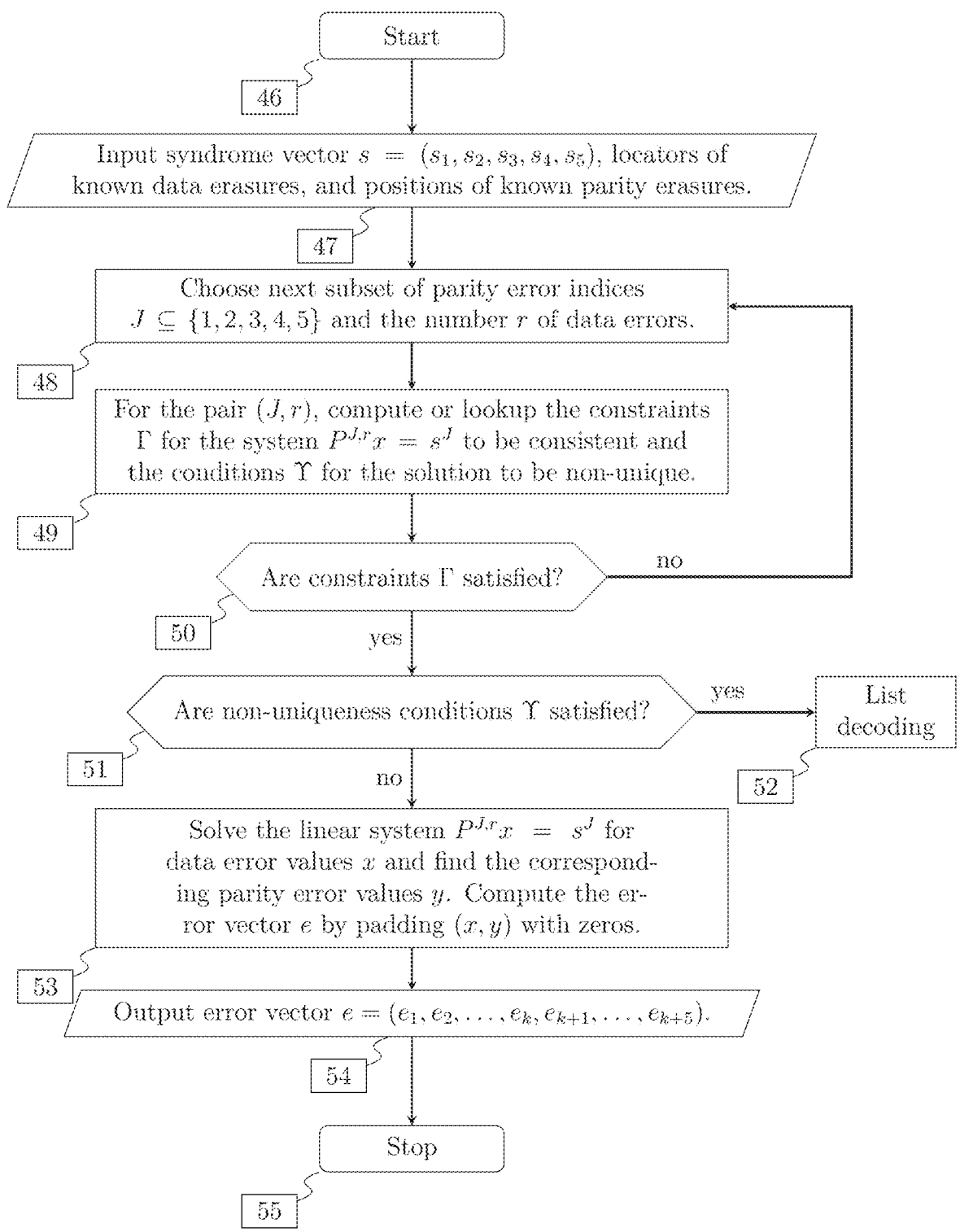
FIG. 6 is a schematic flow diagram of the steps of the main method which decodes combinations of known erasures and errors at unknown locations, comprising the following steps: initial step [46], input of syndromes step [47], choice of parity error indices J and data error number r step [48], lookup of constraints f and non-uniqueness conditions Y step [49], test of consistency constraints step [50], test of non-uniqueness conditions step [51], list decoding branch step [52], solving a system of linear equations for error values step [53], output of error vector step [54], end of the steps of the method [55].

The flowchart in FIG. 6 shows the steps of a preferred method of decoding a received vector and reconstituting data in the sent vector. In input of syndromes step [47] we use the equation s=H·r, wherein H is the parity-check matrix and wherein r is the received vector. The steps of the method are focused on solving the system of linear equation H·e=s to determine the error vector e of minimum weight. The system H·e=s is rewritten in terms of the parity matrix as $$P \cdot e_{data} + e_{parity} = s \quad (7)$$

where $e_{data} = (e_1, e_2, \ldots, e_k)$ is the data segment of the error vector, $e_{parity} = (e_{k+1}, e_{k+2}, e_{k+3}, e_{k+4}, e_{k+5})$ is the parity segment of the error vector. Let l be the set of indices i≤k such that $e_i \neq 0$. Let J be the set of indices j∈{1, 2, 3, 4, 5} such that $e_{k+j} \neq 0$. Let P be the submatrix obtained from the parity-check matrix $P_{5+k}$ by keeping only the columns with indices i∈l. Then $$P^l \cdot e^l + e_{parity} = s \quad (8)$$

The non-zero entries in the parity vector play the role of slack variables, in the following sense: we satisfy a maximal subset of equations of the system $$P^l \cdot e^l = s. \quad (9)$$

By setting slack variables according to the equation:

$$e_{parity} = s - P^l \cdot e^l = s - P \cdot e_{data}$$

we satisfy the remaining equations. If we drop the rows in both sides with indices j∈J, we obtain the simplified equation:

$$P^{J,l} \cdot e^l = s^J \quad (10)$$

where $P^{J,l}$ is obtained from $P^l$ by deleting rows with indices j∈J, $e^l = e^l$ is the vector obtained by keeping entries of e with indices i∈l and $s^J$ is obtained from s by deleting entries with indices j where j∈J. There may be many solutions to the equation H·e=s for a given syndrome vector s. According to maximum likelihood or minimal distance decoding, the solution to the decoding problem for the syndrome vector s is the vector e of minimum weight (i.e. with the minimum number of non-zero entries). The majority of steps of the error correcting method of the invention is directed towards finding such an error vector. The last step of the decoding process is computing the decoded vector r=r−e, where r is the most likely codeword (i.e. a vector in the column space of the generator matrix G), resulting in received vector r, and is also called the sent vector. It will be useful to have (10) in a more explicit form. Let $u_1, u_2, \ldots, u_r$ be variables which in the invention are called data error locators. The steps of the decoding method will set $u_v = \alpha_i v$. Let $x_\mu$ be variables denoting data error values. The steps of the decoding process will set $x_\mu = e_{j\mu}$ for i=1, 2, ..., k. The matrix equation (10) can be then expressed as a subsystem obtained from $$\begin{bmatrix} 1 & 1 & \ldots & 1 \\ u_1 & u_2 & \ldots & u_r \\ u_1^2 & u_2^2 & \ldots & u_r^2 \\ u_1^3 & u_2^3 & \ldots & u_r^3 \\ u_1^2+u_1 & u_2^2+u_2 & \ldots & u_r^2+u_r \end{bmatrix} \begin{bmatrix} x_1 \\ x_2 \\ \ldots \\ x_r \end{bmatrix} = \begin{bmatrix} s_1 \\ s_2 \\ s_3 \\ s_4 \\ s_5 \end{bmatrix} \quad (11)$$

by deleting rows with numbers $j \in J$. For example, for J={2, 4} the deletion of rows step results in the system:

$$\begin{bmatrix} 1 & 1 & \ldots & 1 \\ u_1^2 & u_2^2 & \ldots & u_r^2 \\ u_1^2+u_1 & u_2^2+u_2 & \ldots & u_r^2+u_r \end{bmatrix} \begin{bmatrix} x_1 \\ x_2 \\ \ldots \\ x_r \end{bmatrix} = \begin{bmatrix} s_1 \\ s_3 \\ s_5 \end{bmatrix} \quad (12)$$

In symbolic form this system can be written as a system of algebraic equations $$\sum_{i=1}^{r} f_j(u_i) x_i = b_j, \quad j=1, 2, \ldots, t \quad (13)$$

wherein $\{1, 2, \ldots, 5\} \backslash J = \{j_1, j_2, \ldots, j_t\}$ is the complement of the set J (thus t=5−|J| is the count of elements in the complement of J, wherein |J| denotes the number of elements of the set J, and "\" represents set difference) in the set of all parity indices, and $f_v(u) = g_{j_v}(u)$, wherein $$g_j(u) = \begin{cases} u^{j-1}, & j=1,2,3,4, \\ u^2+u, & j=5. \end{cases}$$

and wherein $b_v = s_{j_v}$ for v=1, 2, ..., t. The system (13) for fixed $r \in \{1, 2, 3, 4, 5\}$ and $J \subseteq \{1, 2, 3, 4, 5\}$ is a system of algebraic equations in variables $u_1, u_2, \ldots, u_r, x_1, x_2, \ldots, x_r$. Apparently the system is non-linear. However, after the data locators $u_i$, i=1, 2, ..., r have been found, the error values are determined from a linear system of equations. Since all variables, including the value of r and the set J, vary over finite domains, there exists a brute force method searching the entire domain. It is inconceivable that brute force search is of practical value. The invention is focused on providing an efficient method. According to some embodiments, in the invention the system is solved by finding exact algebraic solution formulae for solving the problem, requiring a fixed number of operations in the Galois field, and having low, quasi-logarithmic time complexity and quasi-linear space complexity. In solving a system of linear equations for error values step [53] we solve the system (13), which we abbreviate to $$P^{J,r} x = s^J \quad (14)$$

wherein $P^{J,r}$ is the coefficient matrix of the system (13) of linear equations in variables $x_1, x_2, \ldots, x_r$, and wherein $s^J$ denotes a vector obtained from the syndrome vector by deleting entries with indices $j \in J$. For example, $$P^{\{2,4\},2} = \begin{bmatrix} 1 & 1 \\ u_1^2 & u_2^2 \\ u_1^2+u_1 & u_2^2+u_2 \end{bmatrix}, s^{\{2,4\}} = \begin{bmatrix} s_1 \\ s_3 \\ s_5 \end{bmatrix}.$$

The linear system (14) is used to compute the constraints Γ which are necessary and sufficient conditions t to be consistent, by methods of linear algebra, which will be apparent to those skilled in the art. Γ is a set of polynomial equations in variables $u_i$, i=1, 2, ..., r, and the syndromes $s_j$. The linear system (14) is also used to compute the non-uniqueness conditions Y which are necessary and sufficient for the system to have a non-unique solution. The set Y also consists from polynomial equations, involving only the coefficients, i.e. variables $u_i$, i=1, 2, ..., r. Sets Γ and Y are pre-computed and tabulated, and are used in lookup of constraints r and nonuniqueness conditions Y step [49], test of consistency constraints step [50] and test of non-uniqueness conditions step [51]. If during the test of consistency constraints step [50] it is determined that the constraints are not satisfied, we abandon the current pair (J, r) and go back to the choice of parity error indices J and data error number r step [48]. It is important that the pairs are chosen in the order of increasing number of errors, i.e. |J|+r. Also, if there are known erasures amongst parity errors, J should include them. If there are r'≤r known erasures amongst data errors, the values of $u_i$, i=1, 2, ..., r are set to their data locators. If during the test of non-uniqueness conditions step [51] it is determined that the non-uniqueness conditions are satisfied, we move to the list decoding branch step [52]. This step may consider all possible errors by considering multiple equiprobable error vectors (i.e. having the same weight). One application of this branch may be fast identification of failed disks, as the number of failed disk is typically narrowed substantially. Another application of the list decoding branch step [52] is disclosed in FIG. 16. If the test of consistency constraints step [50] succeeds and the test of non-uniqueness conditions step [51] succeeds, we perform the solving a system of linear equations for error values step [53]. Only the pairs (J, r) with |J|+r≤5 should be considered because up to 5 errors are tolerated. The number of such pairs is:

$$\sum_{t=0}^{5} \binom{5}{t}(5-t) = 80.$$

This is an upper bound on the number of times that choice of parity error indices J and data error number r step [48] will be executed. A variant of the invention would process some of the pairs (J, r), and exclude others. One example is a variant limiting the number of erasures Z and errors E, wherein Z+2×E≥4. The preferred embodiment handles all syndrome vectors for which there is a unique error vector e of minimum-weight, by finding said unique error vector. Another variant of the invention handles all syndrome vectors for which at most 2 minimum-weight syndrome vectors exist, by finding a list of said error vectors.

In order to further clarify the test of consistency constraints step [50] and the test of non-uniqueness conditions step [51] of FIG. 6, we turn to an example of calculating Γ and Y wherein J={2, 4} and r=2. The details differ, depending on whether $u_1$ and $u_2$ are known, or one of them is known, or both are unknown, i.e. the details depend on the number of data erasures. The first case is when both $u_1$ and $u_2$ are known (2 data erasures), the linear system (12), set up exactly for this pair (J, r), has a unique solution iff the determinant:

$$\begin{bmatrix} 1 & 1 & s_1 \\ u_1^2 & u_2^2 & s_3 \\ u_1^2+u_1 & u_2^2+u_2 & s_5 \end{bmatrix} = 0.$$

The determinant is found to be equal to:

$$(u_2-u_1)(u_2 s_5+u_1 s_5-u_2 s_3-u_1 s_3-s_3-s_1 u_1 u_2)$$

As $u_2 \neq u_1$ may be assumed (data locators for distinct locations are distinct), the condition of consistency is:

$$u_2 s_5+u_1 s_5-u_2 s_3-u_1 s_3-s_3-s_1 u_1 u_2=0.$$

Furthermore, the condition can be expressed in terms of elementary symmetric poly-nomials $\sigma_1=u_1+u_2$ and $\sigma_2=u_1 u_2$:

$$\sigma_1(s_5+s_3)+s_1\sigma_2+s_3=0. \qquad (15)$$

Therefore, when both $u_1$ and $u_2$ are known, $\Gamma=\{\sigma_1(s_5+s_3)+s_1\sigma_2+s_3\}$. This formula can be found in FIG. 15 in row with j=2, l=4, along with other cases of 4-error combinations, with 2 parity and 2 data errors. The formula is used in the test of consistency constraints step [50], to verify the consistency of the linear system $P^{J,r}x=s^J$ when $u_1$ and $u_2$ are known, i.e. the 2 data errors are both erasures. By inspection, the solution is unique, so Y=∅. The second case is when $u_1$ is a known locator and $u_2$ is not known (1 data erasure). Then (15) is a linear equation for $u_2$:

$$(u_1+u_2)(s_5+s_3)+s_1 u_1 u_2+s_3=0$$

The solution is non-unique iff the coefficient at $u_2$ and the term independent of $u_2$ are both zero:

$$\begin{cases} s_5+s_3 & + & s_1 u_1 = 0 \\ s_3+(s_5+s_3)u_1 & & = 0 \end{cases}$$

Thus, Y={$s_5+s_3+s_1 u_1$, $s_3+(s_3+s_5) u_1$}. If Y is not satisfied, we find that $$u_2 = \frac{s_3+u_1(s_3+s_5)}{s_5+s_3+s_1 u_1}.$$

Thus, $u_2$ is unique. If $u_2$ is a valid locator we proceed to the solving a system of linear equations for error values step [53]. The third case is when $u_1$ and $u_2$ are both unknown (2 errors at unknown location). In this case the solution is typically non-unique and the details are omitted. This ends the walk-through of the steps of the method for J={2, 4} and r=2, and several variants of the method wherein some of the errors are known erasures.

Figure 7:
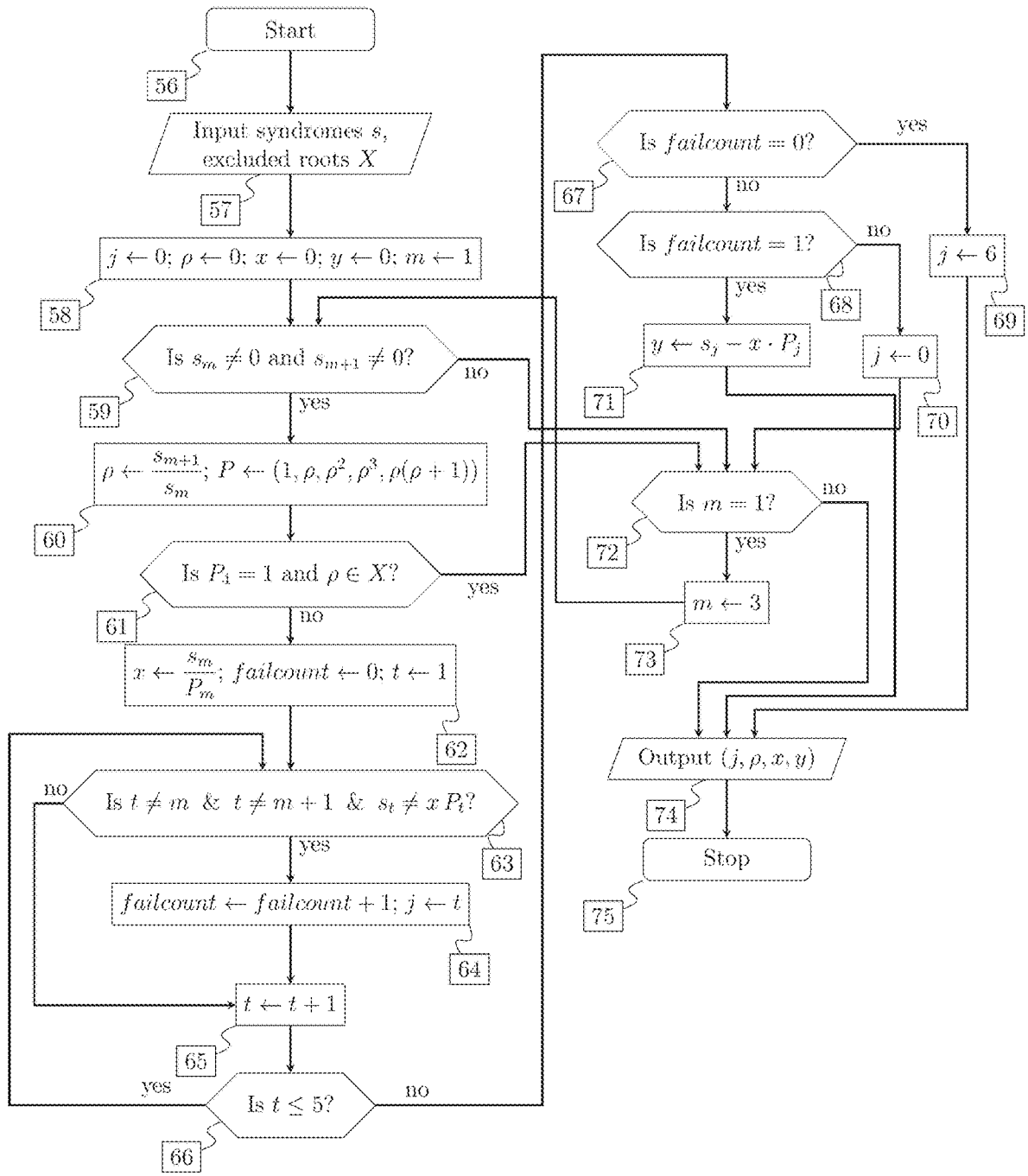
FIG. 7 is a schematic flow diagram of a method to locate 1 failed data and 1 failed parity drive. The flow diagram implements the assignment $(j,\rho,x,y) \leftarrow LocateFailedParityAndData(s,X)$, comprising initial step [56], input of syndromes and excluded roots step [57], initial-ization of variables comprising position of failed parity drive j, Galois field element ρ associated with failed data drive, data error value x, parity error value y and aux-iliary parity index m step [58], comparison of two consecutive syndromes $s_m$ and $s_{m+1}$ to zero step [59], assignment of the ratio of consecutive syndromes $s_m$ and $s_{m+1}$ to ρ and constructing a vector P based on ρ step [60], checking membership of ρ in the set X of excluded roots of unity step [61], assignment of x followed by initializing failure count failcount to 0 and initializing loop counter t to 1 step [62], checking loop counter t and syndrome $s_t$ for consistency with assumptions made step [63], incrementing failure count failcount and updating failed parity drive position j step [64], incrementing of loop counter t step [65], testing whether loop counter t is in range step [66], comparison of failure count with 0 step [67], compar-ison of failure count with 1 step [68], assignment of invalid value 6 to failed parity disk position j step [69], assignment of invalid value 0 to the failed parity disk po-sition j step [70], assignment of the parity error value y step [71], comparison of auxiliary parity index m with value 1 step [72], assignment of value 3 to the auxiliary parity index m step [73], output of failed parity disk position j, Galois field element ρ associated with failed data disk position, data error value x and the parity error value y step [74], and end of the method to locate 1 failed data and 1 failed parity drive step [75].
Figure 8:
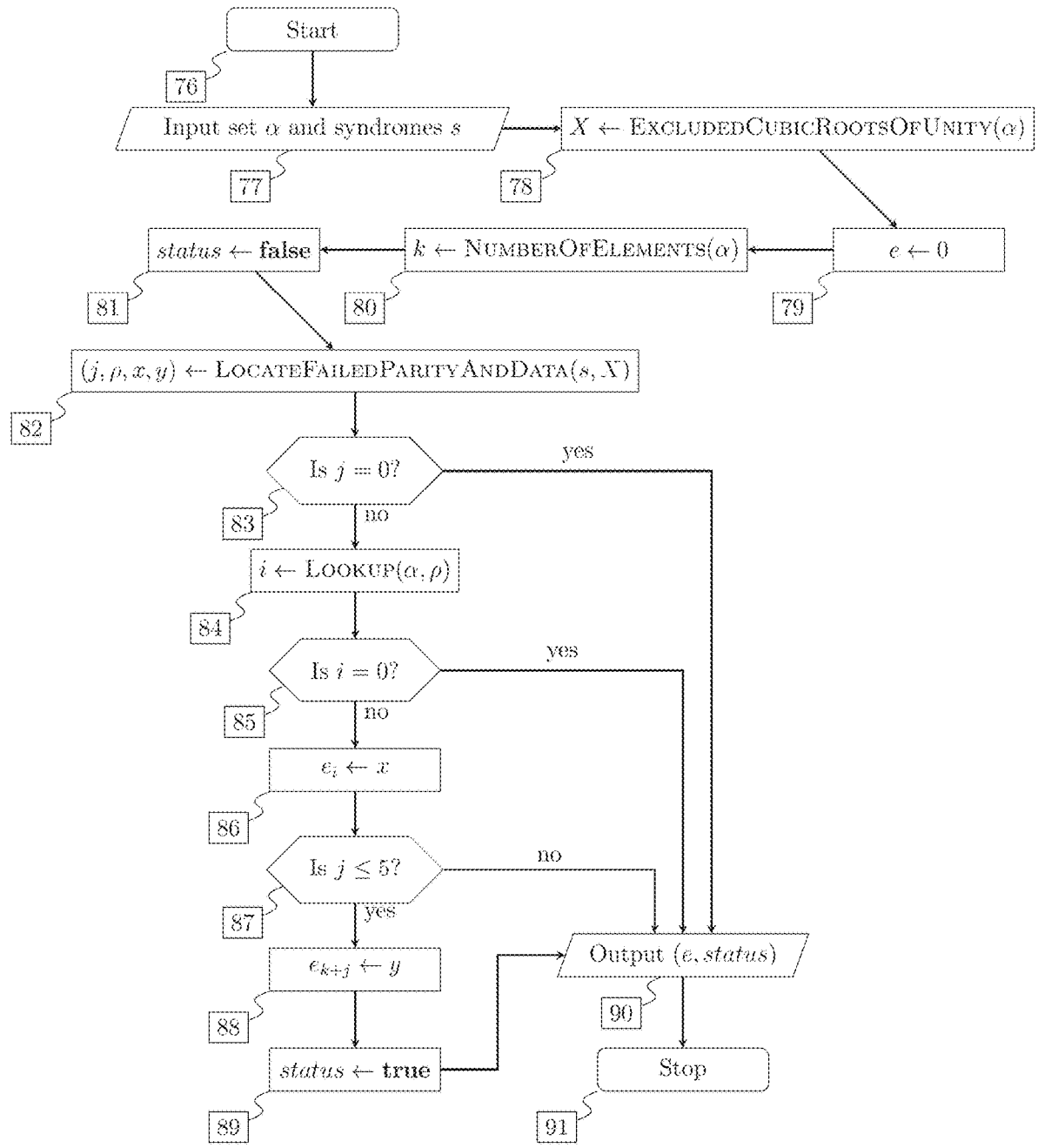
FIG. 8 is a schematic flow diagram of a method to correct error given 1 failed data and 1 failed parity drive. The flow diagram implements the assignment (e,status)←RecoverFailedParityAndData(α,s), comprising start of the method to correct error given 1 failed data and 1 failed parity drive step [76], input of the set of Galois field elements α and the syndrome vector s step [77], assignment of the set of excluded roots of unity to variable X step [78], initialization of error vector e step [79], initial-ization of the data drive count k step [80], initialization of logical variable status step [81], initialization of the failed parity drive position j, the Galois element p associated with the failed data drive, the data error x, and the parity error y step [82], comparison of the failed parity drive position j to invalid value 0 step [83], lookup of the failed data drive position based on the Galois field element p step [84], testing failed data drive position i for invalid value 0 step [85], assignment of data error value x to the element of the error vector $e_i$ step [86], testing validity of the failed parity drive position j step [87], assignment of parity error value y to the element of the error vector $e_{k+j}$ step [88], assignment of true value to the status variable step [89], output of error vector e and status variable status step [90], and end of method to correct error given 1 failed data and 1 failed parity drive step [91].
Figure 9:
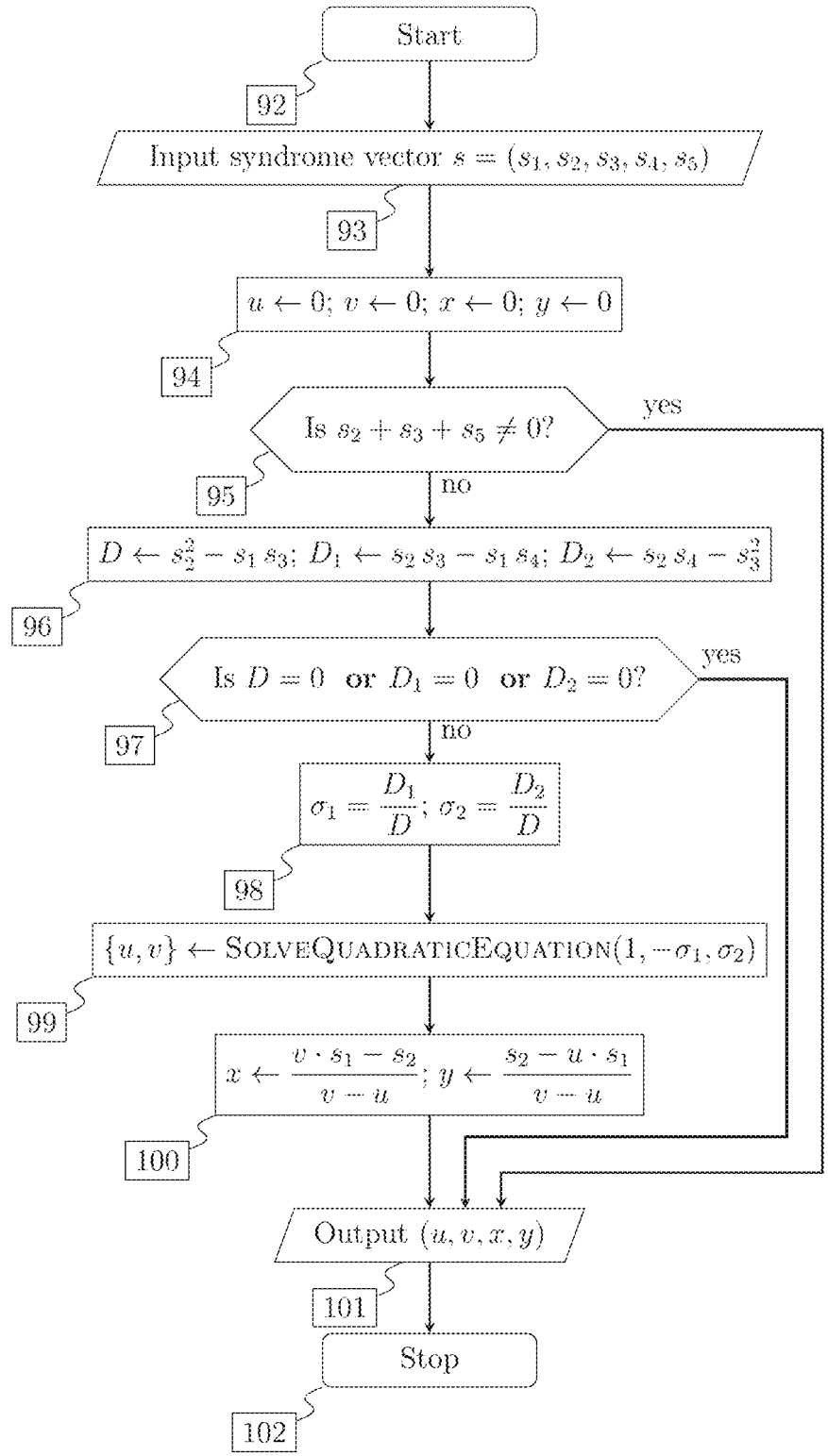
FIG. 9 is a schematic flow diagram of a method to locate 2 failed data drives. The flow diagram implements the assignment (u,v,x,y)←LocateTwoFailedDataDrives(s), comprising start of the method to locate 2 failed data drives step [92], input of the syndrome vector s step [93], initial-ization of Galois field elements u and v associated with failed data drive positions and the corresponding error values x and y step [94], parity consistency check step [95], computing determinants associated with a linear system step [96], comparison of determinants associated with a linear system to zero step [97], computing symmetric polynomial values $\sigma_1$ and $\sigma_2$ of the Galois field elements u and v step [98], computing values u and v associated with failed drive positions by solving a quadratic equation step [99], com-puting error values x and y step [100], output of Galois field elements u and v associated with failed drive positions and the corresponding error values x and y step [101], and end of method to locate 2 failed data drives step [102].
Figure 10:
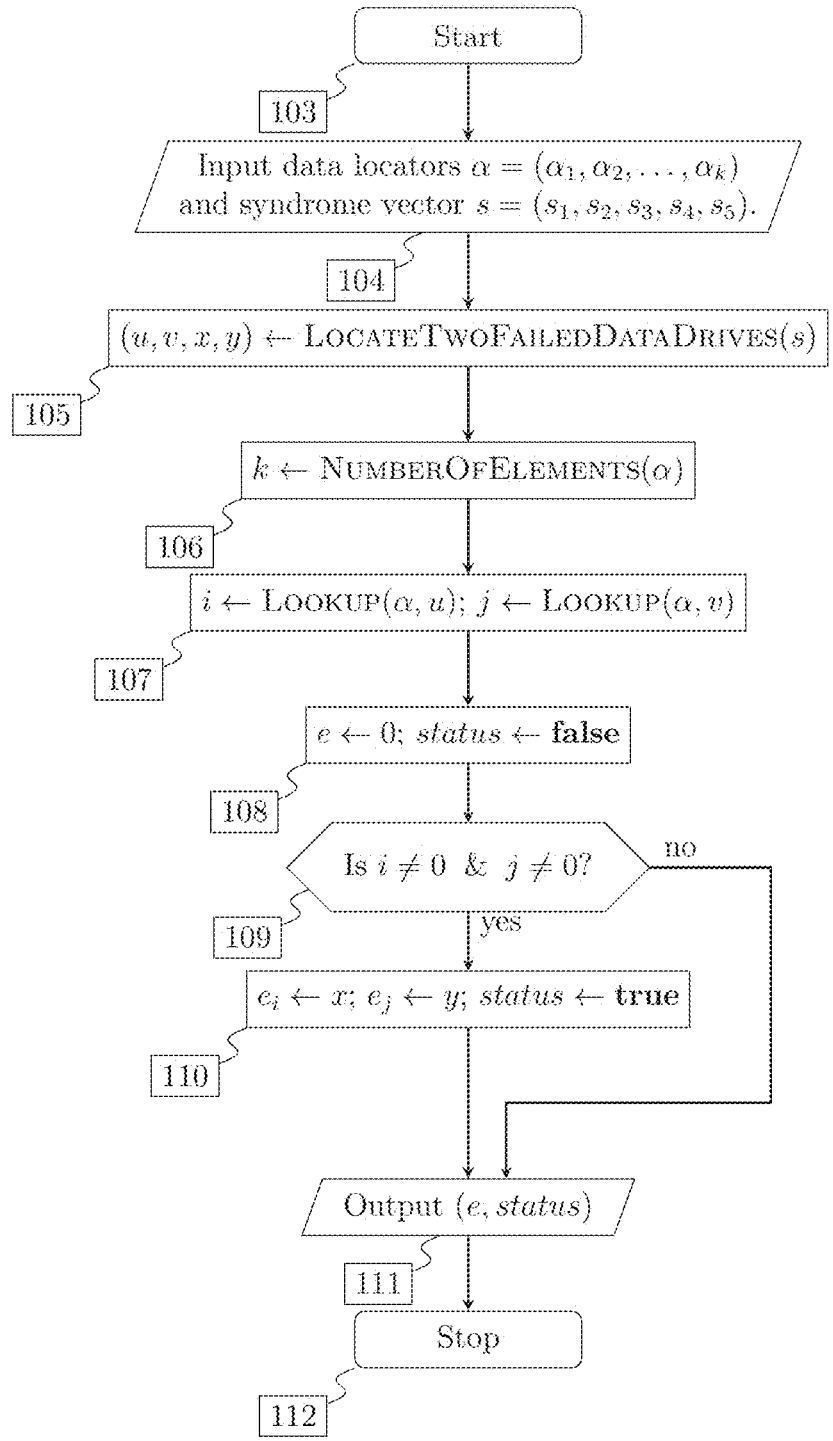
FIG. 10 is a schematic flow diagram of a method to correct errors, given that two data drives failed. The flow diagram implements the assignment (e,status)←RecoverFailedParityAndData(α,s), comprising the following steps: start of the method to correct errors, given that two data drives failed step [103], input of the set of Galois field elements α and the syndrome vector s step [104], computing Galois field elements u and v associated with two drive failures and corresponding error values x and y step [105], assignment of the number of elements of a to variable k step [106], assignment of the locations of the failed data drives to variables i and j step [107], initialization of the error vector e and the status variable status step [108], testing validity of i and j step [109], assignment of error values x and y to the elements of the error vector i and j, and setting status to true as indication of success step [110], output of the error vector e and status variable status step [111], and end of method to correct errors, given that two data drives failed step [112].
Figure 11:
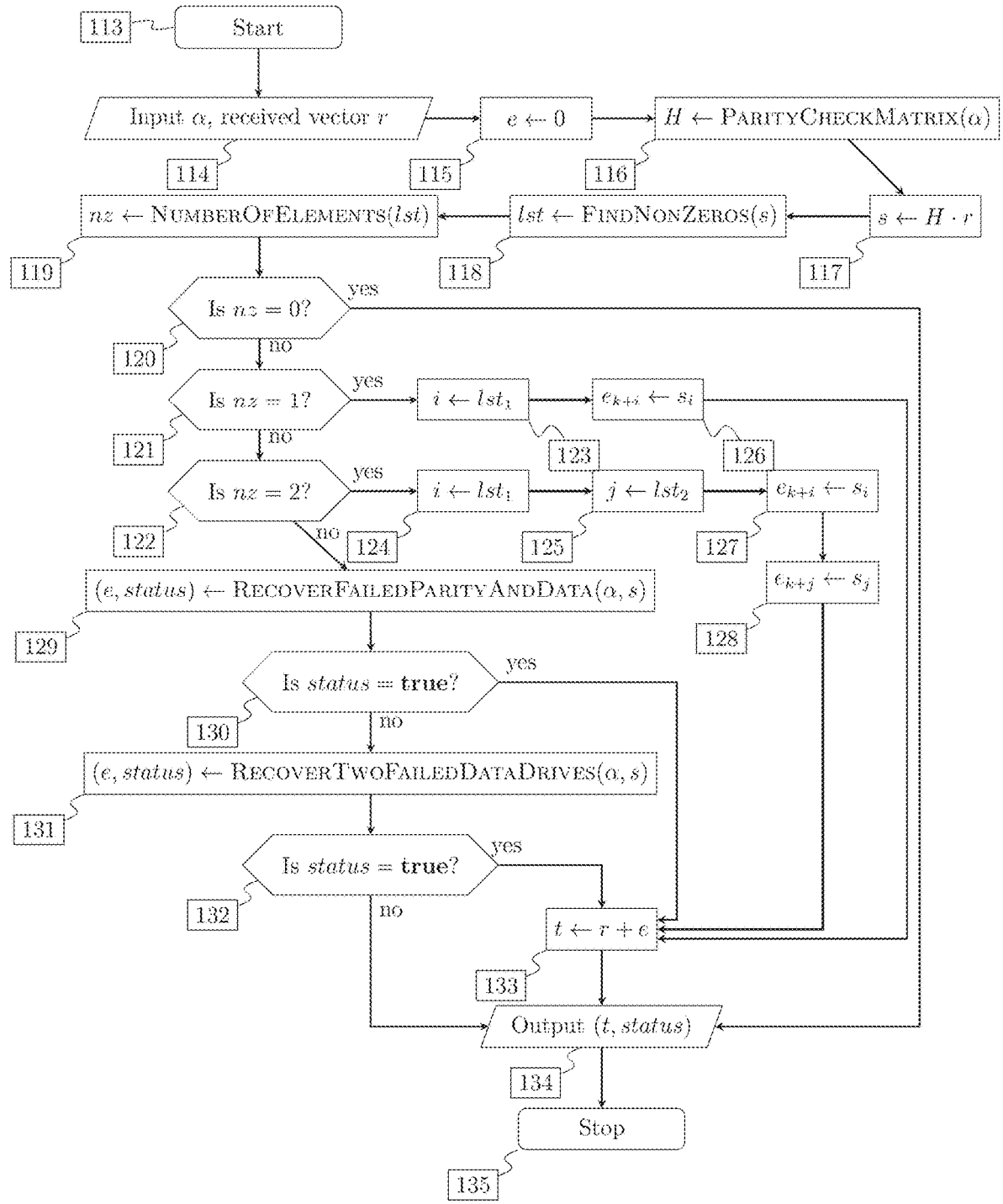
FIG. 11 is a schematic flow diagram of the steps of the method of correct-ing up to two errors at unknown locations, and overall flow control of the decoder, comprising the following steps: start of the method step [113], input of the set of elements of Galois field a and the received vector r step [114], initialization of error vector e to 0 step [115], assignment of parity check matrix to variable H step [116], computation of the syndrome vector s step [117], locating non-zero elements in the syndrome vector s and assignment to the list lst step [118], assignment of the number of non-zero syndromes to the count of non-zero element nz step [119], comparison of the count of non-zero elements nz to 0 step [120], comparison of the count of non-zero elements nz to 1 step [121], comparison of the count of non-zero elements nz to 2 step [122], assignment of the first element of the list lst to position of the first failed parity drive i step [123], assignment of the second element of the list lst to position of the second failed parity drive j step [124], assignment of the single element of the list lst to position of the single failed parity drive j step [125], as signment of syndrome s to the error vector element $e_{k+i}$ step [126], assignment of syndrome $s_i$ to the error value of the first parity drive stored in vector element $e_{k+i}$ step [127], assignment of syndrome $s_i$ to the error value of the second parity drive stored in vector element $e_{k+j}$ step [128], com-puting the error vector e and status value status assuming failure of not more than one parity and not more than one data drive step [129], testing successful recovery under the assumption that not more than one parity and not more than one data drive failed step [130], comput-ing the error vector e and status value status assuming failure of no-parity and not more than two data drive step [131], testing successful recovery under the assump-tion that no parity and not more than two data drives failed step [132], computing the recov-ered vector t step [133], output the recovered vector t and status variable status [134], and end of the method step [135].

Exemplary arrangements of the preferred embodiment in FIGS. 7-11, show detailed steps to correcting all combinations of 2 errors at known or unknown locations. In one aspect, the FIGS. 7-11, implement the general steps of FIG. 6. In another aspect, they provide a complete, self-contained and very detailed method of correcting all combinations of up to 2 errors. In this case the number of known erasures Z and the number of errors at unknown location E satisfy the inequality Z+2×E≥4 thus guaranteeing the existence of a unique error vector e of minimum weight. In the FIGS. 7-11, we assume that the locations of the errors are unknown. A modification wherein one or two of the errors are erasures, will be apparent to those skilled in the art The flowchart in FIG. 7 shows the steps of a preferred method of determining the location of two failed disks, when one of the failed disks is a parity disk, numbered by an integer j in the range from 1 to 5, and the other is a data disk, numbered by an integer i, in the range from 1 to k. The first step is input of syndromes and excluded roots step [57], in which data provided comprises a syndrome vector s=($s_1$, $s_2$, $s_3$, $s_4$, $s_5$), comprised of elements belonging to the Galois field, and X is set to consist of some cubic roots of unity in this Galois field. The syndrome vector s is computed from the equation (3), $$s=H \cdot r$$

where H is the parity check matrix [36] and r is the received vector. The steps leading to computing s from H and r are apparent to those skilled in the art, in particular, anyone familiar with matrix multiplication and algebra of Galois fields, and the general concept of syndrome decoding. In the initialization of variables comprising position of failed parity drive j, Galois field element ρ associated with failed data drive, data error value x, parity error value y and auxiliary parity index m step [58] we initialize j to integer value 0, Galois field values ρ, x and y to the 0 of the Galois field, and the integer counter m to integer 1, where m is generally ranging from 1 to 5, and limited by the method to values 1 and 3. In the explanation that follows, m is either 1 or 3. In the comparison of two consecutive syndromes $s_m$ and $s_{m+1}$ to zero step [59] we compare syndromes $s_m$ and $s_{m+1}$ to 0 in the Galois field. If both syndromes are non-zero, we use their values to calculate their ratio, which we call ρ. In the assignment of the ratio of consecutive syndromes $s_m$ and $s_{m+1}$ to ρ and constructing a vector P based on ρ step [60] we then calculate a Galois vector P with 5 components, which follow the pattern of columns parity matrix, and comprised of the Galois field elements 1, ρ, $ρ^2$, $ρ^3$ and ρ·(ρ+1). In the checking membership of ρ in the set X of excluded roots of unity step [61] a set X of excluded cubic roots of unity is provided and membership. Comparison of $P_4$ to 1 in step the [61] detects whether ρ is a cubic root of unity. If m=1 and ρ∈X, i.e. it has been excluded, m=3 is tried, and ρ is recomputed based on different syndromes.

The drawing in FIG. 12 shows an exemplary arrangement of a preferred embodiment. In the table of FIG. 12 formulae are disclosed used in some steps of the preferred embodiment. These formulae are used to correct 3 errors, wherein 1 of said errors is a data error and 2 of said errors are parity errors. The error correcting code of the invention does not allow correcting 3 errors at unknown locations, but Z=2 erasures and E=1 errors are correctable as Z+2×E=4=D−1, where D=5 is the code distance. Therefore, every row of the table of formulae is used in a plurality of steps of method of correcting 3 errors (at most 3), wherein 2 of the errors are erasures. The first two columns, with headings "j" and "l", specify the parity errors. The column with heading "System of equations for ρ" contains a system of equations for a locator ρ of the data error. The system of equations is obtained by rewriting the matrix equation H·e=s, relating error vector e to the syndrome vector s.

In order to further illustrate the method of FIG. 6 using the formulae in FIG. 12, exemplary steps are presented for correcting 3 errors, wherein j=1, l=2 are two parity error positions, and both parity errors are known erasures. We focus now on the derivation of the first row of the table of FIG. 12. The equation H·e=s is equivalent to the following system of equations, if the data error location is i, $1 \leq i \leq k$ and $\alpha_i = \rho$ denotes the error locator of the data error, and variables $x=e_i$, $y=e_{k+1}$, $z=e_{k+2}$:

$$\begin{cases} x & + y & = s_1 \\ \rho x & & + z = s_2 \\ \rho^2 x & & = s_3 \\ \rho^3 x & & = s_4 \\ \rho(\rho + 1)x & & = s_5 \end{cases} \quad (16)$$

We eliminate variables y and z by simply erasing the first two equations:

$$\begin{cases} \rho^2 x & = s_3 \\ \rho^3 x & = s_4 \\ \rho(\rho + 1)x & = s_5 \end{cases} \quad (17)$$

Elimination of x from the first two equations is attained by multiplying the first equation by $\rho$ and adding the first two equations yields $0 = \rho\, s_3 + s_4$. Multiplying the third equation by $\rho$ and adding all 3 equations yields $0 = \rho s_5 + s_3 + s_4$. This is a derivation of the system of equations in the first row of the table, which is $$\begin{cases} s_5 \rho + s_4 + s_3 = 0 \\ s_3 \rho + s_4 \quad\quad = 0 \end{cases} \quad (18)$$

Other systems of equations in the second column of the table are obtained by a variation of the method. One must ensure equivalence of the system of equations with the original equation H·e=s. The third column of the table is obtained from the above system by eliminating $\rho$, resulting in the equation:

$$s_4 s^5 + s_3 s_4 + s_3^2 = 0 \quad (19)$$

which is a necessary condition for the (overdetermined) system (18) to have a solution. It should be noted that $\rho$ may be either a locator of a known erasure or an unknown locator. If $\rho$ is known, we must check all equations in the third column, hence $\Gamma$ has 2 polynomials:

$$\Gamma = \{s_5\rho + s_4 + s_3, s_3\rho + s_4\}$$

If $\rho$ is unknown, the $\Gamma = \{s_4\ s_5 + s_3\ s_4 + s^2\}$. The column with the heading "Non-Uniqueness Condition" gives the condition for the system to have a non-unique so-lution. It is obtained by requiring that the coefficients at $\rho$ in equations of the form $A\rho + B = 0$ are both 0, and also, in equations A $\rho^2 + B = 0$ must also be both 0 as the Frobenius (squaring) map $\varphi(\rho) = \rho^2$ is an automorphism of the Galois field, and therefore there is only one root of the equation A $\rho^2 + B = 0$ if $A \neq 0$, in a Galois field of characteristic 2. However, the full quadratic equation A $\rho^2 + B\,\rho + C = 0$ may have 2 roots in Galois fields of characteristic 2. We determine the syndrome from the received vector and substitute into (19). If (19) is satisfied, $\rho$ may be found by using one of the equations containing $\rho$, unless the non-uniqueness condition holds. It should be noted that the non-uniqueness condition in each of the rows states that the syndromes which do not correspond to the parity errors must be 0. Since the number of zero syndromes is 3, the most likely error is a pure parity error with two faulty parities j and l, with the corresponding errors $e_{k+j} = s_j$ and $e_{k+6} = s_i$. Thus, they will never be satisfied if we check for 2-error failures before 3-error failures. If (19) is violated, we are certain that the syndrome vector is inconsistent with 2 parity, 1 data error with parity positions j=1, l=2, and try other rows. If all row constraints fail, we look for other types of errors which produce a match. If the data error in a 3-error failure is an erasure, $\rho$ is known. In the exemplary steps of correcting errors with j=1, l=2, the value x is also known, e.g. $x = s_3/\rho^2$. We consider the first 2 equations of (16):

$$\begin{cases} x & + y & = s_1 \\ \rho x & & + z = s_2 \end{cases} \quad (20)$$

Thus, y and z are easily found, and the solution is:

$$\begin{cases} x = \dfrac{s_3}{\rho^2} \\ y = s_1 - x \\ z = s_2 = \rho x \end{cases} \quad (21)$$

Triple errors involving parity only are corrected by noting that the syndrome vector s has 3 non-zero and 2 zero entries, and the 3 non-zero entries are at the error positions. The error values are equal to the syndromes at the same positions.

The drawing in FIG. 13 shows an exemplary arrangement of a preferred embodiment. Triple errors involving 1 parity and 2 data are corrected by a sequence of steps utilizing the table of FIG. 13. We focus now on the steps.

We have now two error locators associated with data errors, which we call $u_1$ and $u_2$. Since there is absolute symmetry under swapping the values $u_1$ and $u_2$, we express the necessary and sufficient conditions to have a solution in terms of symmetric polynomials $\sigma_1 = u_1 + u_2$ and $\sigma_2 = u_1 u_2$. As is apparent, all systems of equations for unknowns $\sigma_1$ and $\sigma_2$ are linear systems. For the system to be consistent, we need the rank of the augmented matrix to be the same as the rank of the coefficient matrix. This leads to a system of equations for certain minors of the augmented matrix. The system is simplified and the result is put in column with heading "Constraint on s". It should be noted that in 3 cases the constraint is empty and in the remaining 2 cases it is a linear equation $s_2 + s_3 + s_5 = 0$. The condition of non-uniqueness is the condition on the rank of the augmented matrix, that the rank be smaller than the number of variables, i.e. 2. Hence, the rank must be 0 or 1, i.e. the coefficient matrix is 0 or all 2×2 minors of it must vanish. This is yet another system of equations which is simplified and put in column with heading "Non-Uniqueness Condition". In all cases, we have the possibility of a non-unique solution. However, we assumed that we have 2 erasures and 1 error at an unknown location. In this case, we know one of the data error locators $u_1$ or $u_2$. We may assume that the known locator is $u_1$ and solve for $u_2$. After both data error locators are found, we solve a non-singular linear system to find the error values. It should be noted that we know in advance that there exists a unique solution as long as the number of erasures is Z=2 and the number of errors is E=1, by the inequality $Z + 2 \times E \leq D - 1 = 4$. As an example illustrating the steps of the method, let us consider correcting a 3-error failure with 2 data errors and 1 parity error, where the parity has j=4. The second row of the table yields necessary condition $s_2+s_3+s_5=0$, which must be satisfied to proceed with the following steps. We have a system of equations $$\begin{cases} s_2\sigma_1 + s_2\sigma_1 = s_3 \\ u_1 + u_2 = \sigma_1 \\ u_1 u_2 = \sigma_2 \end{cases}$$

where the first equation is obtained by substituting $s_5+s_3$ with $s_2$ using a form of the constraint $s_2=s_3+s_5$. Since a is known, we have a linear equation for b only after eliminating $\sigma_1$ and $\sigma_2$:

$$s_2(u_1+u_2)+s_1 u_1 u_2 = s_3$$

Therefore, $(s_2+s_1 u_1) u_2 = s_3+s_2 u_1$ and formally:

$$u_2 = \frac{s_3 + s_2 u_1}{s_2 + s_1 u_1}$$

The solution is non-unique and non-zero (only non-zero data locators are allowed) iff $s_2+s_1 u_1 = s_3 + s_2 u_1 = 0$ which implies that either $s_1=s_2=s_3$ or $$u_1 = \frac{s_2 + s_3}{s_1 + s_2}$$

If $s_1=s_2=s_3$, the constraint implies that $s_5=0$. If $s_1=0$ then $s_1=s_2=s_3=s_5=0$ and the error is matched by a single parity error at position j=2 which is more likely and is handled elsewhere, in an earlier step of the method. Hence, we may assume $s_1 \neq 0$. The equation for $\sigma_1$ and $\sigma_2$ becomes $s_1(\sigma_2+\sigma_2)=s_1$ in view of $s_1=s_2=s_3$ and $s_1\neq 0$ implies $\sigma_1+\sigma_2=1$, or $u_1+u_2+u_1 u_2=1$. Hence, $u_1(1+u_2)=u_1+1$. If $u_1=1$, $u_2$ is arbitrary (non-unique solution); if $u_1\neq 1$ then $u_2=1$. Hence, a non-unique solution only exists if we have erasure at position with locator 1. We may assume $u_1=1$. We have $s_5=0$. Hence $u_1(u_1+1)=0$ and $u_2(u_2+1) y=s_5=0$, where y is the error value for error locator $u_2$. As $u_2(u_2+1) \neq 0$, we have y=0. In particular, the error has only 1 failed data and 1 failed parity, and was considered elsewhere as a 2-error failure and was considered elsewhere. This ends the sequence of exemplary steps for correcting 3 errors, wherein 2 of the errors are known erasures, with some portions of analogous steps omitted, as they will be apparent to those skilled in the art.

The drawings in FIG. 14 and FIG. 13 show exemplary arrangements of a preferred embodiment. Combinations of 4 errors involving 2 data errors and 2 parity errors are corrected by a sequence of steps utilizing the table of FIG. 13. Combinations of 4 errors involving 3 data errors and 1 parity error are corrected by a sequence of steps utilizing the table of FIG. 14. For Z erasures and E errors at unknown locations, statifying the inequality $Z+2\times E \geq 4$ the number E=0, i.e. all errors must be erasures. Therefore, equation (13) is linear and is used only to find error values $x_i$. In one case, all solutions can be found when $Z+2\times E=5$, when we have 2 data errors at known locations (known erasures), 1 data error at unknown location, and 1 parity error at a known location. Using the consistency condition in the second column one shows that at most two locations of the data error at an unknown location are consistent with any syndrome vector s which is not consistent with a 3-error combination.

The steps in FIG. 6 can be used to correct some combinations of 5 errors (|J|+r=5). Only combinations of 5 errors wherein all errors are known erasures can be corrected. The equation (13) is used in its linear form to correct 5 errors, because the data locators $u_j$, j=1, 2, 3, ..., r are known. According to some embodiments, the method of the invention provides error tolerance of a significant fraction of 5 simultaneous erasures. One combination of 5 errors which cannot be corrected is a combination consisting of 5 data erasures, because the coefficient matrix of (13) is singular. Another combination of 5 erasures which cannot be corrected is a combi-nation of 2 parity erasures at parity positions 1 and 4, and 3 data errors (J={1, 4}, r=3 in FIG. 6). All other combinations of 5 known erasures can be corrected. The fraction of such quintuples comprising a particular pair of parity strips is:

$$\frac{\binom{N-2}{3}}{\binom{N}{5}} = \frac{20}{N \times (N-1)}.$$

The fraction of such quintuples consisting of 5 data symbols is:

$$\frac{\binom{N-5}{5}}{\binom{N}{5}} = \prod_{J=0}^{4}\left(1 - \frac{5}{N-J}\right).$$

For example, when N=20, the probability of uncorrectable quintuple of erasures is $1/19 \approx 5\%$ plus $1001/5168 \approx 19\%$, i.e. approximately ¼ of quintuple errors are not correctable. However, with N large the fraction of uncorrectable quintuple errors approaches 100%.

Figure 16:
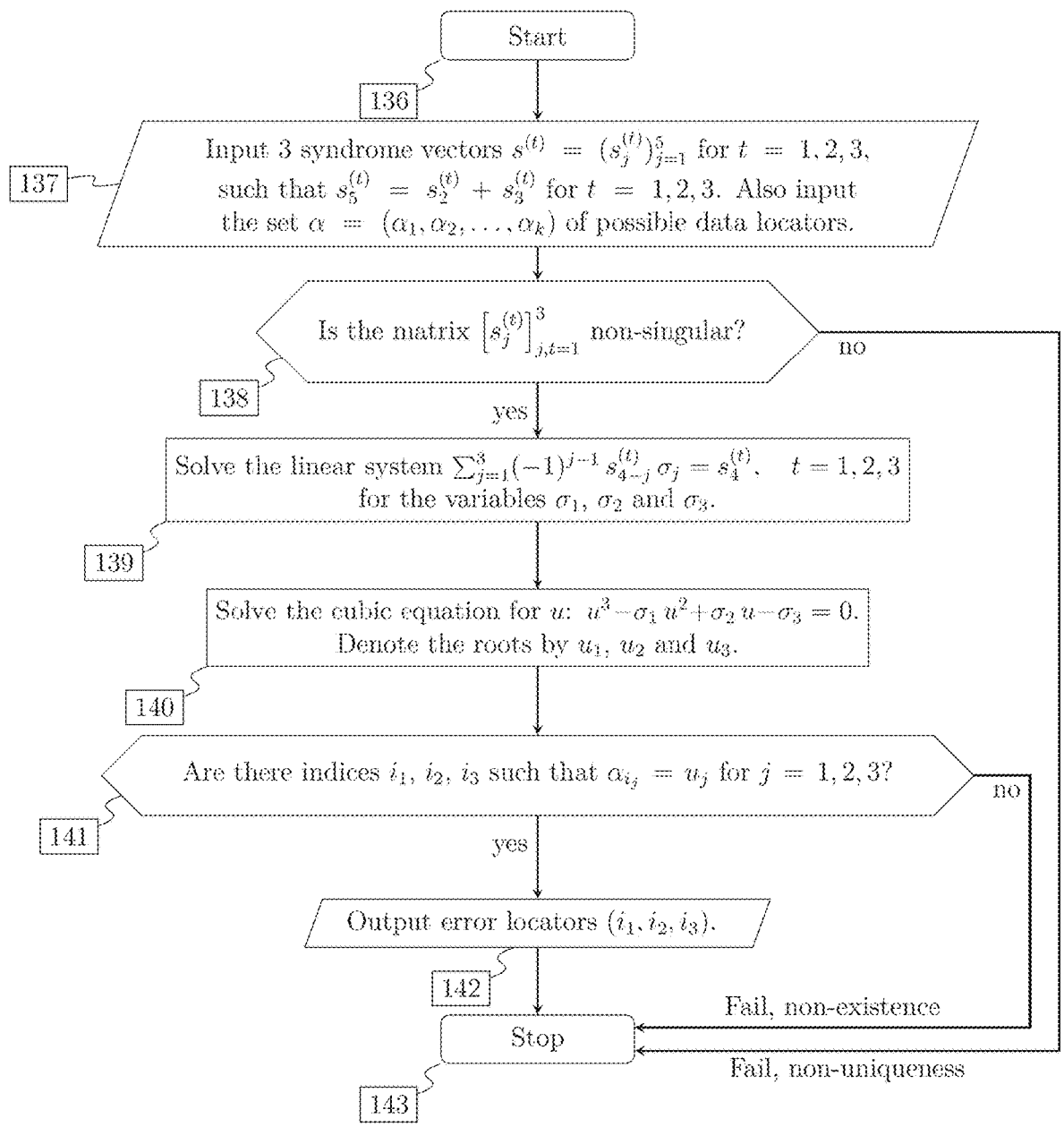
FIG. 16 A schematic flow diagram of the method for decoding 3 data errors at unknown locations, using multiple syndrome vectors computed from dis-tinct stripes having the same 3 data error locations, comprising start of the method step [136], input of 3 syndrome vectors and list of data locators step [137], test-ing of non-singularity of the coefficient matrix step [138], solving a linear equation step [139], solving a cubic equation for data error locators step [140], lookup of error locations step [141], output of data error locations step [142], and end of the the method step [143].

The drawings in FIG. 16 show an exemplary arrangement of a preferred embodiment, directed towards correcting a combination of 3 errors at unknown lo-cations, using list decoding, by collecting the syndrome vectors and possible error vectors obtained during processing of multiple stripes. The steps of the exemplary arrangements are suitable to be incorporated into the list decoding branch step [52] of FIG. 6. The system (13) is:

$$\begin{bmatrix} 1 & 1 & 1 \\ u_1 & u_2 & u_3 \\ u_1^2 & u_2^2 & u_3^2 \\ u_1^3 & u_2^3 & u_3^3 \\ u_1^2+u_1 & u_2^2+u_2 & u_3^2+u_3 \end{bmatrix} \begin{bmatrix} x_1 \\ x_2 \\ x_3 \end{bmatrix} = \begin{bmatrix} s_1 \\ s_2 \\ s_3 \\ s_4 \\ s_5 \end{bmatrix}. \quad (22)$$

One necessary condition for system (22) to be consistent is $s_2+s_3=s_5$, as the last equation is dependent. Another necessary condition is that the determinant:

$$\begin{vmatrix} 1 & 1 & 1 & s_1 \\ u_1 & u_2 & u_3 & s_2 \\ u_1^2 & u_2^2 & u_3^2 & s_3 \\ u_1^3 & u_2^3 & u_3^3 & s_4 \end{vmatrix} = 0. \quad (23)$$

Those skilled in the art will check that this determinant equals $$\sum_{j=1}^{3}(-1)^{j-1}s_{4-j}\sigma_j$$

where $\sigma_1=u_1+u_2+u_3$, $\sigma_2=_1 u_2+u_1u_3+u_2u_3$ and $\sigma_3=u_1u_2 u_3$ are the elementary symmetric polynomials. Therefore, the consistency conditions for J=∅ and r=3 in FIG. 6 are $$\Gamma = \left\{ s_2 + s_3 + s_{5'} \sum_{j=1}^{3}(-1)^{j-1}s_{4-j}\sigma_j \right.$$

When $u_1$, $u_2$ and $u_3$ are unknown, we typically have more than one solution to (22), thus in FIG. 6 the list decoding branch step [52] will be executed. The steps of the exemplary arrangement are directed towards recovering lost data due to 3 data errors at unknown locations, using multiple syndrome vectors obtained from at least 3 distinct stripes sharing the 3 data error locations and having no parity errors. It will be apparent to those skilled in the art how to incorporate the steps of the exemplary arrangement into the list decoding branch step [52]. We focus now on the steps of FIG. 16. In the input of 3 syndrome vectors and list of data locators step [137] 3 syndromes are input obtained by collecting lists of multiple error vectors from multiple faulty stripes. Thus, it is assumed that there exists a subset l⊆{1, 2, . . . }, wherein |l|=3, of data positions such that the 3 received vectors $r^{(1)}$, $r^{(2)}$ and, $r^{(3)}$ admit 3 error vectors $e^{(1)}$, $e^{(2)}$ and $e^{(3)}$ such that H $e^{(t)}=s^{(t)}$ for t=1, 2, 3, and such that $e^{(t)}=0$ unless j∈l. In the output of data error locations step [142] we output the set l={$i_1$, $i_2$, $i_3$}. In solving a linear equation step [139] we solve a system of linear equations obtained by applying the consistency conditions to the 3 syndrome vectors. In solving a cubic equation for data error locators step [140] we obtain the values of $u_1$, $u_2$ and $u_3$ by solving a cubic equation. In the lookup of error locations step [141] we check whether the values $u_1$, $u_2$ and $u_3$ are valid data error locators by looking them up in the set α. In the output of data error locations step [142] we output the set l for further processing, e.g. finding the three error vectors $e^{(t)}$, t=1, 2, 3 and correcting all errors in the 3 faulty stripes. Furthermore, it will be apparent to those skilled in the art that if 4 linearly independent syndromes are found with the same set l, then |l|≥4, hence the method can exclude the possibility of 3 data errors in 3 stripes occurring at the same locations. It will be apparent to those skilled in the art how to modify the exemplary method to look for any combination of known and unknown error locations which repeats in multiple stripes. One application of the method is to identify small sets of multiple faulty disks, or disk controllers, or other computer components, which systematically generate errors at the same locations.

Supplementary embodiments of the present invention feature a method for reconstituting data lost via faulty strips in the received vector by calculating said lost data from non-faulty strips comprising the associated stripe. Each stripe may contain Z+E faulty strips where Z is the number of faulty strips at known locations and E is the number of faulty strips at unknown locations, wherein Z and E are any whole, non-negative numbers satisfying the inequality Z+2× E≥4. Further details of the data recovery method are described in the appendix section of U.S. Provisional Patent Application No. 66/449,920 filed on Jan. 24, 2017, which is/are incorporated here in their entirety by reference. Additional further details of this data recovery method are featured in the appended document: (*Efficient Error Correcting Codes for Dual-Disk Corruption*, Moussa and Rychlik 2018).

It will thus be seen that the objects set forth above, among those made apparent from the preceding description, are efficiently attained and, because certain changes may be made in carrying out the above method and in the construction(s) set forth without departing from the spirit and scope of the invention, it is intended that all matter contained in the above description and shown in the accompanying drawings shall be interpreted as illustrative and not in a limiting sense.

It is also to be understood that the following claims are intended to cover all of the generic and specific features of the invention herein described and all statements of the scope of the invention which, as a matter of language, might be said to fall therebetween.

Various modifications of the invention, in addition to those described herein, will be apparent to those skilled in the art from the foregoing description. Such modifications are also intended to fall within the scope of the appended claims. Each reference cited in the present application is incorporated herein by reference in its entirety.

Although there has been shown and described the preferred embodiment of the present invention, it will be readily apparent to those skilled in the art that modifications may be made thereto which do not exceed the scope of the appended claims. Therefore, the scope of the invention is only to be limited by the following claims. Reference numbers recited in the claims are exemplary and for ease of review by the patent office only, and are not limiting in any way. In some embodiments, the figures presented in this patent application are drawn to scale, including the angles, ratios of dimensions, etc. In some embodiments, the figures are representative only and the claims are not limited by the dimensions of the figures. In some embodi-ments, descriptions of the inventions described herein using the phrase "comprising" includes embodiments that could be described as "consisting of", and as such the written description requirement for claiming one or more embodiments of the present invention using the phrase "consisting of" is met.

The reference numbers recited in the below claims are solely for ease of examination of this patent application, and are exemplary, and are not intended in any way to limit the scope of the claims to the particular features having the corresponding reference numbers in the drawings.

REFERENCES

Anderson, M. H. and S. Mann (2014). *Accelerated erasure coding system and method*.
U.S. Pat. No. 8,683,296. url: https://www.google.com/patents/U.S. Pat. No. 8,683,296.
Anvin, Peter H. (2009). The Mathematics of RAID-6. url: https://www.kernel. org/pub/linux/kernel/people/hpa/raid6.pdf.
Bairavasundaram, Lakshmi N. et al. (2008). "An Analysis of Data Corruption in the Storage Stack". In: *Trans. Storage* 4.3, 8:1-8:28. issn: 1553-3077. doi: 10.1145/1416944.1416947. url: http://doi.acm.org/10.1145/1416944.1416947.
Grigoriev, D. (2013). "Polynomial Complexity of Solving Systems of Few Algebraic Equations with Small Degrees". In: *LECTURE NOTES IN COMPUTER SCIENCE* 1.8136, 136-139. url: http://www.ingentaconnect.com/content/ssam/03029743/2013/00000001/00008136/art00011.

Leventhal, Adam (2009). "Triple-Parity RAID and Beyond". In: *Queue* 7.11, 30:30-30:39. issn: 1542-7730. doi: 10.1145/1661785.1670144. url: http://doi.acm.org/10.1145/1661785.1670144.

Mann, Sarah Edge (2013). *The Original View of Reed-Solomon Coding and the Welch-Berlekamp Decoding Algorithm.* url: http://hdl.handle.net/10150/301533.

Moon, Todd K. (2005). "Linear Block Codes". In: *Error Correction Coding.* John Wiley & Sons, Inc., 83-112. isbn: 9780471739210. doi: 10.1002/0471739219. ch3. url: http://dx.doi.org/10.1002/0471739219.ch3.

Moussa, Mohamad and Marek Rychlik (2018). *Efficient Error Correcting Codes for Dual-Disk Corruption.* Submitted to USPTO as a document accompanying the non-provisional utility patent on Jan. 19, 2018; extended and updated version of the paper submitted on Jan. 24, 2017 with the provisional patent applica-tion.

Plank, James S. (1997). "A Tutorial on Reed-Solomon Coding for Fault-Tolerance in RAID-like Systems". In: *Software—Practice & Experience* 27.9, 995-1012.

Plank, James S. and Y. Ding (2005). "Note: Correction to the 1997 Tutorial on Reed-Solomon Coding". In: *Software—Practice & Experience* 35.2, 189-194.

Rozier, Eric W. D. et al. (2009). "Evaluating the impact of Undetected Disk Errors in RAID systems". English. In: 83-92. isbn: 9781424444229; 1424444225;

Schönhage, Arnold and Volker Strassen (1971). "Schnelle Multiplikation groller Zahlen." In: *Computing* 7.3-4, 281-292. url: http://dblp.uni-trer.de/db/journals/computing/computing7.html#SchonhageS71.

What is claimed is:

1. A method of encoding data for providing higher fault tolerance to an associated array of disks in subsequent decoding, said array storing a plurality of identically sized logical or physical blocks of data, herein referred to as stripes, said method comprising:

(a) logically or physically partitioning each stripe into $k \geq 1$ identically sized strips, herein referred to as data strips, wherein each data strip stores a portion of the data blocks of an associated stripe;

(b) numbering the data strips in each stripe with whole numbers 1, 2, 3, ..., k;

(c) calculating parity data comprising x parity strips and numbered k+1, k+2, k+3, k+4, ... k+x, wherein the calculating comprises:

(i) selecting k non-zero distinct elements of a Galois field $GF(2^m)$, denoted by $\alpha_1, \alpha_2, \ldots, \alpha_k$, and (ii) calculating parity of each parity strip according to the formula $$P_{j,\ell} = \sum_{i=1}^{k} M_{j,i} \cdot D_{i,\ell}$$

wherein j is a parity strip index, associated with parity strip numbered k+j in the associated strips, and $\ell$ is a stripe index of the associated stripe, and (d) extending each stripe of the plurality of stripes into an encoded strips by combining k data strips and the x parity strips and comprising a total of k+x strips to generate a plurality of encoded stripes, wherein the data strips are generated using a systematic coding of encoding data, wherein extending each stripe of the plurality of strips by combining k data strips and the x parity stripes provides an enhanced fault tolerance; and (e) storing the plurality of encoded strips in the array of disks such that each strip of the associated encoded stripe is stored in a unique disk in the array of disks, wherein each disk stores at least one strip from each encoded stripe, and wherein an order of the strips in each stripe can be optionally changed prior to storing to implement load balancing.

2. The method of claim 1 wherein the subsequent decoding of the plurality of encoded stripes of data comprises subjecting the plurality of encoded strips to an error-generating process, the error-generating process comprising storage and retrieval of data from disks and data transmission over a noisy channel, and wherein the decoding further comprises identifying and correcting combinations of errors at known and unknown locations in the plurality of encoded stripes of data, wherein most likely combinations of errors are given higher priority over less likely combinations of errors.

3. The method of claim 2 further comprising a syndrome decoding, comprising:

(a) calculating a plurality of syndrome vectors $s\ell = (s_{j,\ell})_{j=1}$, $\ell = 1, 2, \ldots, L$, according to formula:

$$s_{j,\ell} = \sum_{i=1}^{k} M_{i,j} \cdot r_{i,\ell} + r_{k+j,\ell}$$

wherein $r_{i,\ell}$ denotes data retrieved from disk i and stripe $\ell$, for i=1, 2, ..., k+x and $\ell = 1, 2, \ldots, L$, wherein L is the total number of stripes;

(b) calculating elements of the Galois field, herein referred to as error locators, by performing arithmetic operations in the Galois field;

(c) identifying error locations based on the error locators, wherein an error locator value equal to $\alpha_i$ for some i designates data strip with index i as a faulty strip;

(d) calculating error values; and (e) reconstituting lost data in each faulty strip by calculating lost data from non-faulty strips.

4. The method of claim 3, further comprising:

(a) identifying at most two faulty strips of data in each stripe retrieved herein referred to as received vector, from the array of disks, wherein the identifying does not require prior knowledge of a location of content of the faulty strips in the received vector, the identifying further comprising calculating two or more syndromes and syndrome ratios for the received vector to identify the at most two faulty strips of data; and (b) reconstituting lost data in the faulty strips in the received vector by calculating said lost data from non-faulty strips comprising the associated strip, wherein the method provides fault tolerance due to a combination of at most two errors at known or unknown locations.

5. The method of claim 4, further comprising:

(a) computing a location of the faulty strips with unknown locations; and (b) calculating lost data from non-faulty strips and reconstituting the lost data in the plurality of faulty strips of the received vector, wherein each stripe contained Z faulty strips at known locations and E faulty strips at unknown locations, and wherein Z and E are nonnegative whole numbers such that $Z+2\times E \leq 2\times floor(x/2)$.

6. The method of claim 5, wherein the number of Galois field operations is independent of the number of disks in the array.

7. The method of claim 3, further comprising list decoding whereby a listing of most likely error vectors is produced for a given syndrome vector, in an order of decreasing likelihood.

8. The method of claim 7, wherein a complete listing of all of the most likely error vectors is produced for each syndrome vector, for which said complete listing of all of the most likely error vectors comprises at most two error vectors.

9. The method of claim 8, wherein the number of Galois field operations is independent of the number of disks in the array.

10. The method of claim 7, further comprising providing fault tolerance of up to 5 errors by collecting lists of most likely error vectors from multiple stripes, and using the lists to reconstitute the lost data, wherein providing the fault tolerance comprises:
    (a) searching for multiple stripes where the list of error vectors share a set of common error locations;
    (b) identifying locations of errors in said multiple stripes at the set of common error locations; and
    (c) reconstituting lost data in said multiple stripes.

11. The method of claim 10 wherein each stripe contains at most three faulty data strips, and none of the faulty parity strips.

12. The method of claim 3, further comprising listing up to two possible error locations for one data error at unknown location, wherein each stripe contains four faulty strips, wherein two of the faulty strips are data strips at known locations, a third strip is a data strip at an unknown location, and a fourth strip is a parity strip at a known location.

13. A method of encoding data logically or physically partitioned into a plurality of identically sized data blocks called stripes, said method comprising:
    (a) logically or physically partitioning each stripe into k≥1 identically sized strips, herein referred to as data strips, wherein each data strip stores a portion of the data blocks of an associated stripe;
    (b) numbering the data strips in each stripe with whole numbers 1, 2, 3, . . . , k;
    (c) calculating parity data comprising five parity strips, distinct from the data strips, and numbered k+1, k+2, k+3, k+4, . . . , k+x, wherein the calculating comprises:
        (i) selecting k non-zero distinct elements of a Galois field GF($2^m$), denoted by $\alpha_1, \alpha_2, \ldots, \alpha_k$; and
        (ii) calculating parity of each parity strip according to the formula $$P_{j,\ell} = \sum_{i=1}^{k} M_{j,i} \cdot D_{i,\ell}$$

wherein j is a parity strip index, associated with parity strip numbered k+j in the associated strips, and $\ell$ is a stripe index of the associated stripe, and
    (d) extending each stripe of the plurality of stripes into an encoded stripe by combining k data strips and the five parity strips and comprising a total of k+x strips to generate a plurality of encoded stripes, wherein the data strips are unmodified and generated using a systematic coding of encoding data.

14. A system of encoding data for providing higher fault tolerance to an associated array of disks in subsequent decoding, said array storing a plurality of identically sized logical or physical blocks of data, herein referred to as stripes, the system comprising: (i) one or more processors, and (ii) a memory coupled to the one or more processors, the memory to store computer-executable instructions that, when executed by the one or more processors, cause the one or more processors to perform operations comprising:
    (a) logically or physically partitioning each stripe into k≥1 identically sized strips, herein referred to as data strips, wherein each data strip stores a portion of the data blocks of an associated stripe;
    (b) numbering the data strips in each stripe with whole numbers 1, 2, 3, . . . , k;
    (c) calculating parity data comprising five parity strips, distinct from the data strips, and numbered k+1, k+2, k+3, k+4 and k+x, wherein the calculating comprises:
        (i) selecting k non-zero distinct elements of a Galois field GF($2^m$), denoted by $\alpha_1, \alpha_2, \ldots, \alpha_k$; and
        (ii) calculating parity of each parity strip according to the formula $$P_{j,\ell} = \sum_{i=1}^{k} M_{j,i} \cdot D_{i,\ell}$$

wherein j is a parity strip index, associated with parity strip numbered k+j in the associated strips, and $\ell$ is a stripe index of the associated stripe, and
    (d) extending each stripe of the plurality of stripes into an encoded stripe by combining k data strips and the five parity strips and comprising a total of k+x strips to generate a plurality of encoded stripes, wherein the data strips are unmodified and generated using a systematic coding of encoding data; and
    (e) storing the plurality of encoded stripes in the array of disks such that each strip of the associated encoded stripe is stored in a unique disk in the array of disks, wherein each disk stores one strip from each encoded stripe, and wherein an order of the strips in each stripe can be optionally changed prior to storing to implement load balancing,
wherein the step of extending each stripe of the plurality of stripes by combining k data strips and the five parity stripes provides an enhanced fault tolerance.

15. The system of claim 14, wherein the subsequent decoding of the plurality of encoded stripes of data comprises subjecting the plurality of encoded stripes to an error-generating process, the error-generating process comprising storage and retrieval of data from disks and data transmission over a noisy channel, and wherein the decoding further comprises identifying and correcting combinations of errors at known and unknown locations in the plurality of encoded stripes of data, wherein most likely combinations of errors are given higher priority over less likely errors.

16. The system of claim 15, wherein the subsequent decoding further comprises a syndrome decoding, wherein the syndrome decoding comprises:
    (a) calculating a plurality of syndrome vectors
    $s^\ell = (s_{j,}\ell)_{j=1}^x$, $\ell =1, 2, \ldots, L$, according to formula:

$$s_{j,\ell} = \sum_{i=1}^{k} M_{i,j} \cdot r_{i,\ell} + r_{k+j,\ell}$$

wherein $r_{i,}\ell$ denotes data retrieved from disk i and stripe $\ell$, for i=1, 2, . . . , k+x and $\ell$ =1, 2, . . . , L, wherein L is the total number of stripes;

(b) calculating elements of the Galois field, herein referred to as error locators, by performing arithmetic operations in the Galois field;
(c) identifying error locations based on the error locators, wherein an error locator value equal to $\alpha_i$ for some i designates data strip with index i as a faulty strip;
(d) calculating error values; and
(e) reconstituting lost data in each faulty strip by calculating lost data from non-faulty strips.

17. The system of claim 16, wherein the memory includes additional instructions that, when executed by the one or more processors, cause the one or more processors to perform operations comprising:
(a) identifying at most two faulty strips of data in each stripe retrieved, herein referred to as received vector, from the array of disks, wherein the identifying does not require prior knowledge of a location or content of the faulty strips in the received vector, the identifying further comprising calculating two or more syndromes and syndrome ratios for the received vector to identify the at most two faulty strips of data;
(b) reconstituting lost data in the faulty strips in the received vector by calculating said lost data from non-faulty strips comprising the associated strip, wherein the operation provides fault tolerance due to a combination of at most two errors at known or unknown locations;
(c) computing a location of the faulty strips with unknown locations; and
(d) calculating lost data from non-faulty strips and reconstituting the lost data in the plurality of faulty strips of the received vector, wherein each stripe contains Z faulty strips at known locations, and E faulty strips at unknown locations, and wherein Z and E are nonnegative whole numbers such that $Z+2\times E \leq 2\times floor(x/2)$, wherein the number of Galois field operations is independent of the number of disks in the array.

18. The system of claim 16, wherein the memory includes additional instructions that, when executed by the one or more processors, cause the one or more processors to perform operations comprising:
(a) performing list decoding comprising producing a listing of most likely error vectors for a given syndrome vector, in an order of decreasing likelihood; and
(b) producing a complete listing of all of the most likely error vectors for each syndrome vector, for which said complete listing of all of the most likely error vectors comprises at most two error vectors, wherein the number of Galois field operations is independent of the number of disks in the array.

19. The system of claim 18, wherein each stripe contains several faulty data strips, and none of the faulty parity strips.

20. The system of claim 16, wherein the memory includes additional instructions that, when executed by the one or more processors, cause the one or more processors to perform operations comprising:
(a) listing a plurality of possible error locations for at least one data error at an unknown location, wherein each stripe contains a plurality of faulty strips, wherein at least a portion of the faulty strips are data strips at known locations.

* * * * *